US009855741B2

(12) United States Patent
Otsuka et al.

(10) Patent No.: US 9,855,741 B2
(45) **Date of Patent: *Jan. 2, 2018**

(54) LIQUID DISCHARGING APPARATUS

(71) Applicant: Seiko Epson Corporation, Tokyo (JP)

(72) Inventors: Shuji Otsuka, Shiojiri (JP); Tadashi Kiyuna, Hachioji (JP); Toshifumi Asanuma, Hamura (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/279,213

(22) Filed: Sep. 28, 2016

(65) Prior Publication Data

US 2017/0015098 A1 Jan. 19, 2017

Related U.S. Application Data

(63) Continuation of application No. 14/671,033, filed on Mar. 27, 2015, now Pat. No. 9,481,165, which is a continuation of application No. 14/212,512, filed on Mar. 14, 2014, now Pat. No. 9,022,498.

(30) Foreign Application Priority Data

Mar. 22, 2013 (JP) ................................ 2013-059208

(51) Int. Cl.

*H03K 17/687* (2006.01)
*B41J 2/045* (2006.01)
*B41J 2/14* (2006.01)

(52) U.S. Cl.

CPC ....... *B41J 2/04541* (2013.01); *B41J 2/04506* (2013.01); *B41J 2/04508* (2013.01); *B41J 2/04581* (2013.01); *B41J 2/04588* (2013.01); *B41J 2/14233* (2013.01)

(58) Field of Classification Search

USPC ................................ 327/108–111; 347/9–11
See application file for complete search history.

(56) References Cited

U.S. PATENT DOCUMENTS 7,410,233 B2 8/2008 Kitami et al.
7,896,456 B2 3/2011 Iwashita et al.
8,253,463 B1 8/2012 Chromczak et al.
(Continued)

FOREIGN PATENT DOCUMENTS

JP 2004-066640 A 3/2004
JP 2010-030182 A 2/2010
(Continued)

*Primary Examiner* — An Luu
(74) *Attorney, Agent, or Firm* — Harness, Dickey & Pierce, P.L.C.

(57) ABSTRACT

In a capacitive load drive circuit, a first driving signal generator generates a first driving signal from a first control signal according to a characteristic of a first capacitive load, and a second driving signal generator generates a second driving signal from a second control signal according to a characteristic of a second capacitive load. A control signal supply portion supplies a common control signal to the first driving signal generator and the second driving signal generator. The first driving signal generator corrects the common control signal to generate the first control signal, and the second driving signal generator corrects the common control signal to generate the second control signal.

5 Claims, 14 Drawing Sheets

(56) References Cited

U.S. PATENT DOCUMENTS

| | | | |
|---|---|---|---|
| 8,313,160 | B2 | 11/2012 | Matsuo |
| 9,022,498 | B2 | 5/2015 | Otsuka et al. |
| 9,349,937 | B2 * | 5/2016 | Otsuka ................ B41J 2/04588 |

FOREIGN PATENT DOCUMENTS

| | | | |
|---|---|---|---|
| JP | 2011-045192 | A | 3/2011 |
| JP | 2012-218197 | A | 11/2012 |

* cited by examiner

<FIRST STATE: CHARGING>

<SECOND STATE: CHARGING>

<SECOND STATE: DISCHARGING>

<FIRST STATE: DISCHARGING>

<STATE A (TERMINAL a SELECTION)>

<STATE B (TERMINAL b SELECTION)>

LIQUID DISCHARGING APPARATUS

This application is a continuation of, and claims priority under 35 U.S.C. §120 on, U.S. application Ser. No. 14/671,033, filed Mar. 27, 2015, which is a continuation of, U.S. application Ser. No. 14/212,512, filed Mar. 14, 2014, now U.S. Pat. No. 9,022,498, issued on May 5, 2015, which claims priority under 35 U.S.C. §119 on Japanese patent application no. 2013-059208, filed Mar. 22, 2013. The content of each such related application is incorporated by reference herein in its entirety.

BACKGROUND

1. Technical Field

The present invention relates to a technology that has a capacitive load as a driving target, such as using a piezoelectric element to discharge liquid droplets.

2. Related Art

A print head equipped with a plurality of head units in which numerous nozzles are formed has been proposed in the related art (for example, JP-A-2012-218197). Each head unit includes a plurality of piezoelectric elements which cause liquid droplets of ink or the like to be discharged from the nozzles. A control signal (COM) for driving each piezoelectric element is commonly supplied from the control unit with respect to the plurality of head units, and each piezoelectric element in the respective head units is driven according to the control signal.

The characteristics of each piezoelectric element (for example, the deformation amount with respect to an applied voltage) may differ for each head unit caused by, for example, circumstances such as manufacturing errors. Accordingly, in a configuration of the related art in which a common control signal is used across the plurality of head units in driving each piezoelectric element, the discharge amount of the liquid droplets differs for each head unit and this difference in the discharge amounts is a cause of lowering of the print quality. If a configuration that separately generates a control signal for each head unit is adopted, although it is possible to reduce the differences in discharge amount of the liquid droplets for each head unit, a signal generating circuit that generates a control signal should be provided for each head unit, and there is a problem in that the size and complexity of the apparatus configuration increase.

SUMMARY

An advantage of some aspects of the invention is to reduce the influence of differences in the characteristics in each capacitive load.

According to an aspect of the invention, there is provided a first driving signal generator that generates a first driving signal from a first control signal according to a characteristic of a first capacitive load; a second driving signal generator that generates a second driving signal from a second control signal according to a characteristic of a second capacitive load; and a control signal supply portion that supplies a common control signal to the first driving signal generator and the second driving signal generator. The first driving signal generator corrects the common control signal to generate the first control signal, and the second driving signal generator corrects the common control signal to generate the second control signal. According to the configuration, since the first driving signal and the second driving signal are generated from a common control signal supplied to the first and second driving signal generators according to the characteristic of the first capacitive load and the characteristic of the second capacitive load respectively, the influence of differences in the characteristics of the first capacitive load and the second capacitive is reduced.

According to a preferred aspect of the invention, waveforms of the first driving signal are different from waveforms of the second driving signal. According to the aspect, since the waveforms of the driving signals are different, it is possible to effectively reduce the influence of differences in the characteristics of the capacitive loads.

According to another preferred aspect of the invention, the first driving signal generator includes a first control signal correction portion that corrects the common control signal according to the characteristic of the first capacitive load, and generates the first driving signal from the first control signal after correction of the common control signal by the first control signal correction portion, and the second driving signal generator includes a second control signal correction portion that corrects the common control signal according to the characteristic of the second capacitive load, and generates the second driving signal from the second control signal after correction of the common control signal by the second control signal correction portion. More preferably, the first control signal correction portion and the second control signal correction portion preferably each include a first holding portion that holds a first correction value; a second holding portion that holds a second correction value; and a correction processor that corrects the amplitude of the common control signal according to the first correction value and corrects a reference voltage (voltage of start point or finishing point of a printing period) of the common control signal according to the second correction value. According to the aspect, it is possible to highly accurately reduce the influence of the difference in characteristics of the first capacitive load and the second capacitive load.

According to another preferred aspect of the invention, each of the driving signal generators includes a voltage generator that generates a plurality of voltages; and a connection path selector that selects the plurality of voltages generated by the corresponding voltage generator according to the corresponding control signal after correction of the common control signal by the corresponding control signal correction portion, and supplies the voltages as the driving signal to a capacitive load.

Another feature, embodied in a liquid discharging apparatus, further includes a first signal path to which a first voltage is applied by the voltage generator, and a second signal path to which a second voltage higher than the first voltage is applied by the voltage generator, and the connection path selector electrically connects the capacitive load to the voltage generator using the first signal path or the second signal path according to the voltage of the control signal after correction by the control signal correction portion and the hold voltage of the capacitive load. Accordingly, charging and discharging of the capacitive load are executed by electrically connecting the capacitive load to the first signal path or the second signal path, and since the electrical connection is regulated taking not only the voltage of the control signal, but also the hold voltage of the capacitive load into consideration, it is possible to control the capacitive load with a fine voltage. Since charging and discharging of the capacitive load proceed in a stepwise manner, it is possible to increase energy efficiency between power source voltages compared to a configuration of the related art that performs charging and discharging all at once. Since switching of a large current such as a class D amplifier is not performed, the generation of electromagnetic interference (EMI) can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
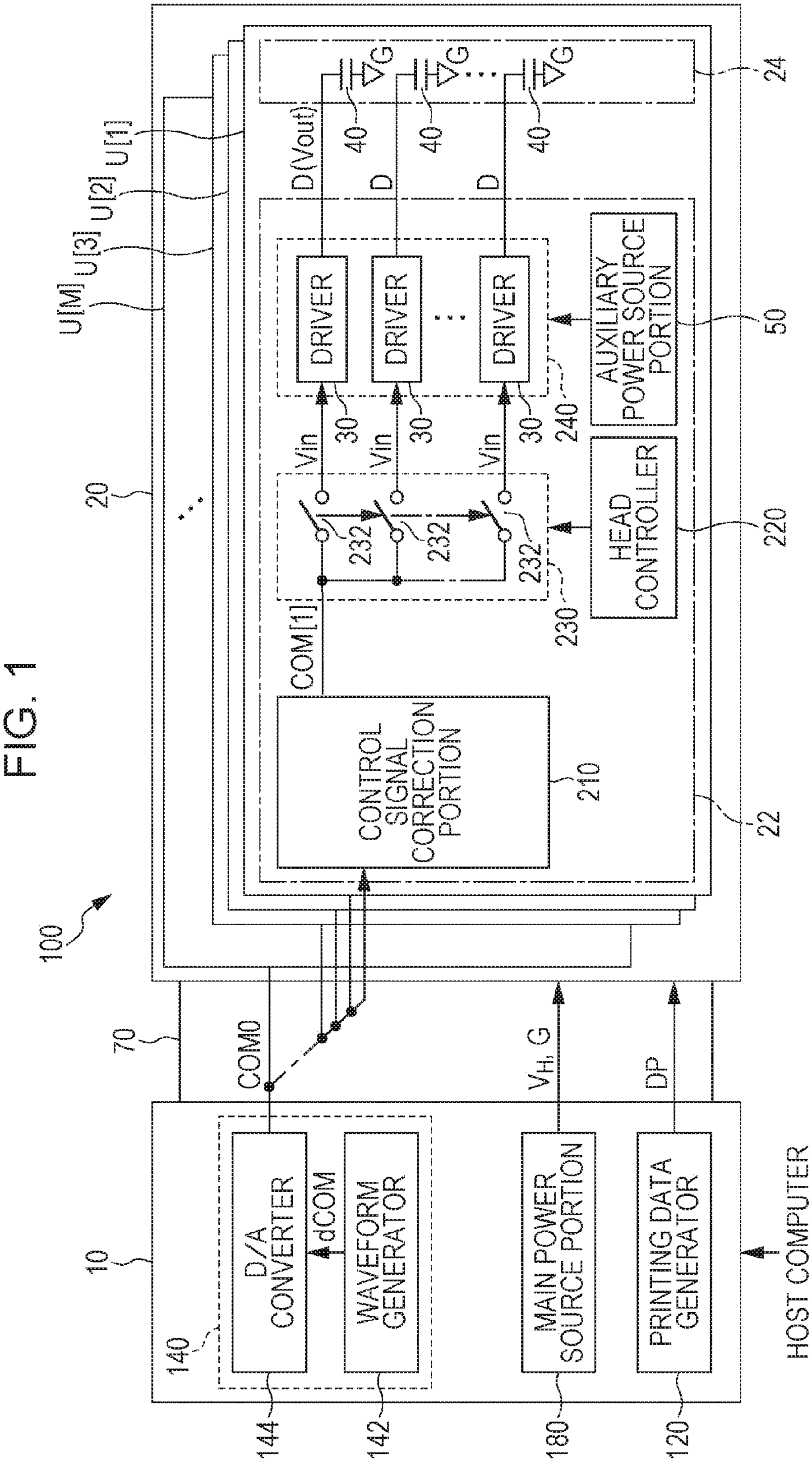
FIG. 1 is a diagram showing a schematic configuration of a printing apparatus.

FIG. 1 is a block diagram of a printing apparatus 100 according to a preferred embodiment of the invention. The printing apparatus 100 of the present embodiment is a liquid discharging apparatus that prints an image on a recording material by discharging droplets of ink (hereinafter, referred to as "ink droplets") on the recording material such as a printing paper.

As shown in FIG. 1, printing apparatus 100 includes a control unit 10, a print head (head module) 20 and a flexible flat cable (FFC) 70. The ink droplets are discharged from each of a plurality of nozzles of the print head 20 on the recording medium based on control by the control unit 10. The printing apparatus 100 of the embodiment is a serial-type ink jet printer in which the print head 20 is mounted on a carriage (not shown) that moves in a direction (main scanning direction) that intersects the transport direction (sub-scanning direction) of the recording material. The control unit 10 is arranged on a control substrate (not shown) outside the carriage. The FFC 70 is a flexible wiring substrate that electrically connects control unit 10 and the print head 20.

The control unit 10 is an element that executes calculation processing and control processing for printing an image depicted with image data supplied from a host computer (not shown), and includes a printing data generator 120, a control signal supply portion 140 and a main power source portion 180.

The main power source portion 180 generates a power source voltage $V_H$ and a ground potential (ground) G. The ground G corresponds to a voltage reference value (voltage zero), and the power source voltage $V_H$ is a high order side voltage of the ground G. The power source voltage $V_H$ and the ground g are supplied to the print head 20 via the FFC 70.

The printing data generator 120 and the control signal supply portion 140 in FIG. 1 are realized by a calculation processing device (CPU) or various logic circuits that execute a program recorded, for example, in a memory circuit, such as a RAM. Although an element that controls the transport mechanism that transports the recording material and an element that controls the movement mechanism that moves the carriage are arranged in the control unit 10, neither is shown in FIG. 1 for the sake of convenience.

The printing data generator 120 generates printing data DP by executing various calculation processes (for example, image development process, color conversion process, color separation plate processing, half-tone processing, or the like) with respect to image data supplied from the host computer. The printing data DP indicates designates discharge or non-discharge of an ink droplet and the discharge amount of the ink droplet for each nozzle of the print head 20. The printing data DP generated by the printing data generator 120 is supplied to the print head 20 via the FFC 70.

Figure 4:
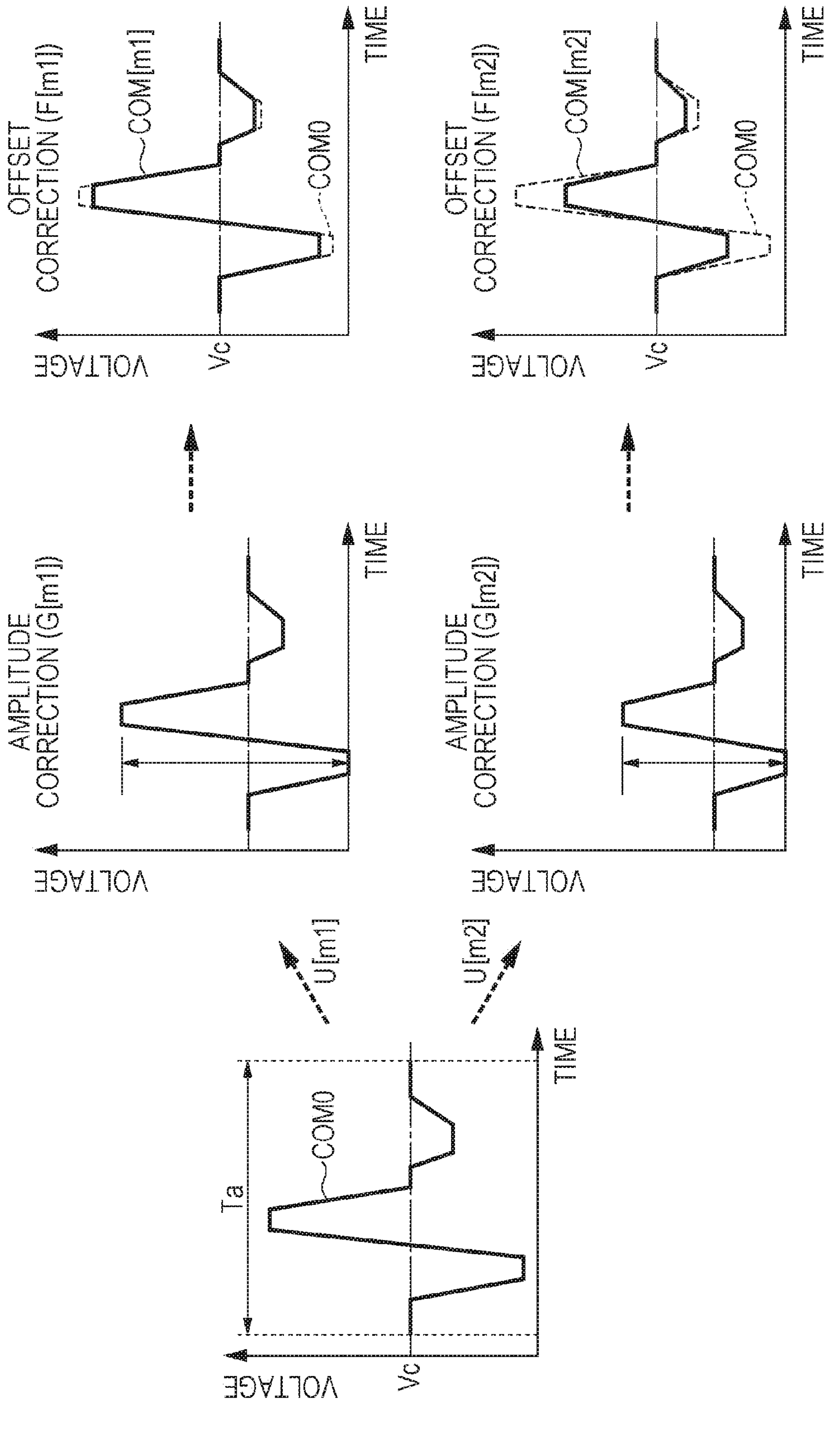
FIG. 4 is an explanatory diagram of an operation of the control signal correction portion.

The control signal supply portion 140 is an element that generates a control signal COM0 for causing ink droplets to be discharged from each nozzle of the print head 20, and is configured to include a waveform generator 142 and a D/A converter 144. The waveform generator 142 generates a digital control signal dCOM that shows a predetermined waveform. The D/A converter 144 converts the control signal dCOM generated by the waveform generator 142 to an analog control signal COM0. The control signal COM0 generated by the control signal supply portion 140 is supplied to the print head 20 via the FFC 70. As shown in FIG. 4, the control signal COM0 is a periodic signal in which the voltage fluctuates from a reference voltage VC for each printing period Ta. More specifically, a voltage signal in which a plurality of driving pulses for causing ink droplets to be discharged from each nozzle of the print head 20 are arranged in time series for each printing period Ta is used as the control signal COM0. The control signal COM0 can be supplied as a differential signal to the print head 20 from the control unit 10.

As shown in FIG. 1, the print head 20 includes M (M is a natural number of 2 or higher) head units U[1] to U[M]. A common control signal COM0 is supplied from the control unit (control signal supply portion 140) to the M head units U[1] to U[M].

Each of the M head units U[1] to U[M] is a module (head chip) in which a driving signal generator 22 and a discharge portion group 24 are integrally configured. The discharge portion group 24 is configured to included N (N is a natural number) discharge portions 400 (FIG. 2) that correspond to different piezoelectric elements 40. Each piezoelectric element 40 is a capacitive load in which cavities (ink chambers) to which ink is supplied via flow channels are disposed. As a result of the volume of the cavity fluctuating by the piezoelectric element 40 deforming by charging and discharging in light of supply of the driving signal D, ink droplets are discharged from the nozzles corresponding to the piezoelectric element 40. As can be understood from the above description, the driving signal generator 22 is disposed for each of M blocks (head units U[1] to U[M]) in which M×N piezoelectric elements 40 included in the print head 20 are divided into N units.

Figure 2:
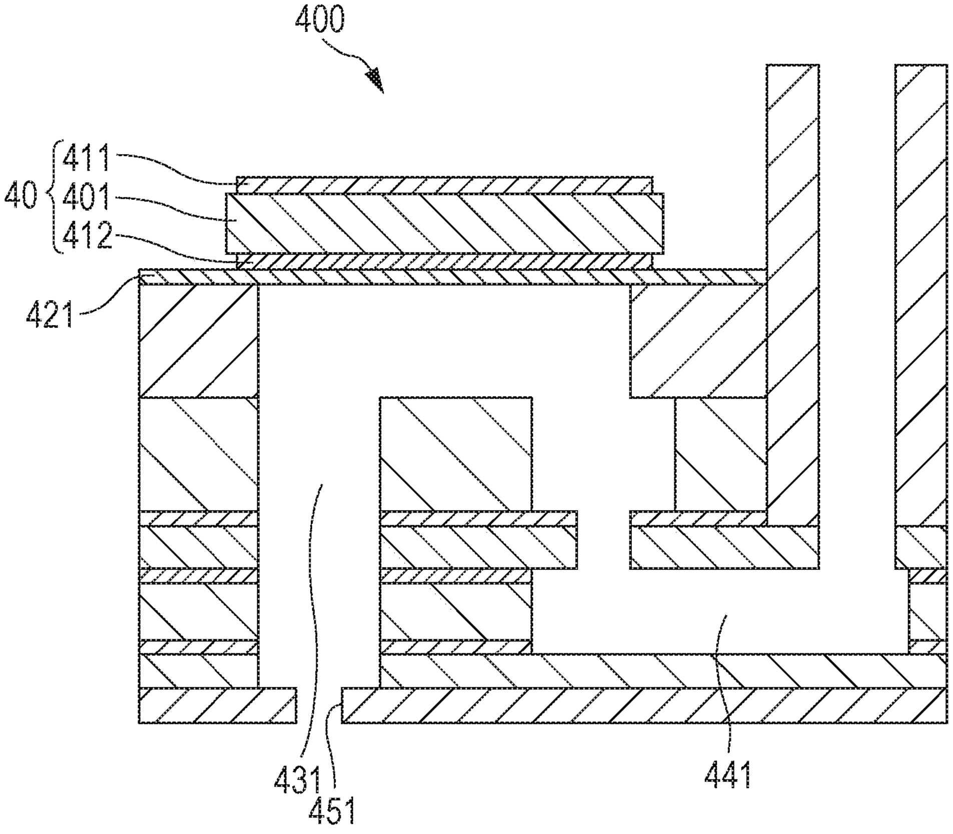
FIG. 2 is a diagram showing an essential configuration of a discharge portion in a print head.

FIG. 2 is a diagram showing a schematic configuration of the discharge portion 400 corresponding to one nozzle from the print head 20. As shown in FIG. 2, the discharge portion 400 includes the piezoelectric element 40, a diaphragm 421, a cavity (pressure chamber) 431, a reservoir 441 and a nozzle 451. Among these, the diaphragm 421 changes according to the piezoelectric element 40 provided on the upper surface in the drawing, and the internal volume of the cavity 431 filled with ink is caused to expand and contract. The nozzle 451 is an opening portion that communicates with the cavity 431.

The piezoelectric element 40 shown in the drawing is generally referred to as a unimorph (monomorph) type, and has a structure in which a piezoelectric body 401 is interposed between a pair of electrodes 411 and 412. In the piezoelectric body 401 with this structure, the central portion in the drawing, as well as the electrodes 411 and 412 and the diaphragm 421, flexes in the vertical direction with respect to both end portions according to a voltage applied between the electrodes 411 and 412. Since the internal volume of the cavity 431 expands if flexed upwards, ink is drawn in from the reservoir 441, whereas if flexed downwards, since the internal volume of the cavity 431 contracts, ink is discharged from the nozzle 451. The piezoelectric element 40 is not limited to a unimorph-type, and any type, such as a bimorph-type or laminated-type, able to cause a liquid such as ink to be discharged by deforming a piezoelectric element may be used.

As can be understood from the above description, the print head 20 includes M discharge portion groups 24 corresponding to different head units U[1] to U[M], and the driving signal generator 22 is arranged for each of the M discharge portion groups 24.

The relationship between the applied voltage with respect to the piezoelectric element 40 and the deformation amount of the piezoelectric element 40 (that is, the rank of the conversion efficiency) and the mechanical characteristics of the cavity 431 (that is, the characteristics of the discharge portion group 24) may be different for each head unit U[m] (m=1 to M) caused by various circumstances such as manufacturing errors. On the other hand, differences in the characteristics of N piezoelectric elements 40 from one head unit U[m] are sufficiently small compared to the differences in the characteristics of the piezoelectric elements 40 between each head unit U[m]. In the present embodiment, although a case in which the number N of piezoelectric elements 40 is common across the M head units U[1] to U[M] is given as an example, the number N of piezoelectric elements 40 may be different for each head unit U[m].

The driving signal generator 22 is an element that generates a driving signal D according to a control signal COM0 supplied from the control unit 10 for each piezoelectric element 40 of the discharge portion group 24 and supplies the signal to each piezoelectric element 40, and includes a control signal correction portion 210, a head controller 220, a selector 230, an element driving portion 240, and an auxiliary power source portion 50, as shown in FIG. 1. Each element of the driving signal generator 22 is realized, for example, by one or plurality of semiconductor integrated circuits (IC chip).

The element driving portion 240 is an element that drives N piezoelectric elements 40 of each head unit U[m], and, as shown in FIG. 1 is configured to include N drivers 30 corresponding to the different piezoelectric elements 40 in a latter stage discharge portion group 24. That is, there is a one to one correspondence between each driver 30 of the element driving portion 240 and each piezoelectric element 40 of the discharge portion group 24, and N sets of piezoelectric elements 40 and drivers 30 are formed for each of the M head units U[1] to U[M]. One end of each piezoelectric element 40 is connected to the output end of the driver 30 corresponding to the piezoelectric element 40, and the other end of each piezoelectric element 40 is grounded to the ground G.

The control signal correction portion 210 in FIG. 1 generates a control signal COM[m] by correcting the control signal COM0 supplied from the control unit 10. That is, the control signal COM[m] (COMM to COM[M]) is separately generated for each head unit U[m] from the control signal COM0 that is common across the M head units U[1] to U[M]. The waveforms of the generated control signals COM[1] to COM[M] are different for each head unit U[m]. The specific configuration and operation of the control signal correction portion 210 will be described later.

The selector 230 includes N switches 232 corresponding to the different piezoelectric elements 40. Each switch 232 has a one to one correspondence with each set of the driver 30 and the piezoelectric element 40. The control signal COM[m] after correction by the control signal correction portion 210 is supplied in common to one end of each of the N switches 232 of the head units U[m], and the other end of each switch 232 is connected to the input end of the driver 30 corresponding to the switch 232. Accordingly, when one switch 232 is controlled to be in an on state, the control signal COM[m] is supplied to a latter stage driver 30 of the switch 232, and when the switch 232 is controlled to be in an off state, supply of the control signal COM[m] corresponding to the latter stage driver 30 of the switch 232 stops.

The head controller 220 in FIG. 1 controls each of the N switches 232 of the selector 230 to be in the on state or the off state according to the printing data DP supplied from the printing data generator 120 of the control unit 10. More specifically, the head controller 220 controls each switch 232 to be in an on state or an off state in each of a plurality of segments in which the printing period (1 period) Ta of the control signal COM[m] is divided on the time axis. Accordingly, the control signal Vin selectively extracted from each segment of the control signal COM[m] after correction by the control signal correction portion 210 is supplied to the latter stage driver 30. It is possible to supply a plurality of control signals COM0 with different waveforms to the print head 20 from the control unit 10, and selectively use the control signals in driving each piezoelectric element 40.

The auxiliary power source portion 50 is a voltage generator (booster circuit) that generates a plurality of voltages by using a voltage $V_H$ supplied from the main power source portion 180 of the control unit 10 via the FFC 70. More specifically, the auxiliary power source portion 50 generates a 1/6 voltage ($V_H/6$), a 2/6 voltage ($2V_H/6$), a 3/6 voltage ($3V_H/6$), a 4/6 voltage ($4V_H/6$) and a 5/6 voltage ($5V_H/6$) of the voltage $V_H$ by voltage division and redistributing the voltage $V_H$ with a charge pump circuit, and commonly supplies these with the voltage $V_H$ with respect to the N drivers 30. Each driver 30 uses the plurality of voltages supplied from the auxiliary power source portion 50, and generates and supplies the driving signal D according to the control signal Vin supplied from the selector 230 to each piezoelectric element 40. More specifically, the control signal D of the voltage Vout that tracks the voltage of the control signal Vin is supplied to the piezoelectric elements from each driver 30. Since one end of the piezoelectric element 40 is grounded, the voltage Vout of the driving signal D corresponds to the voltage held by the piezoelectric element 40.

Control Signal Correction Portion

Figure 3:
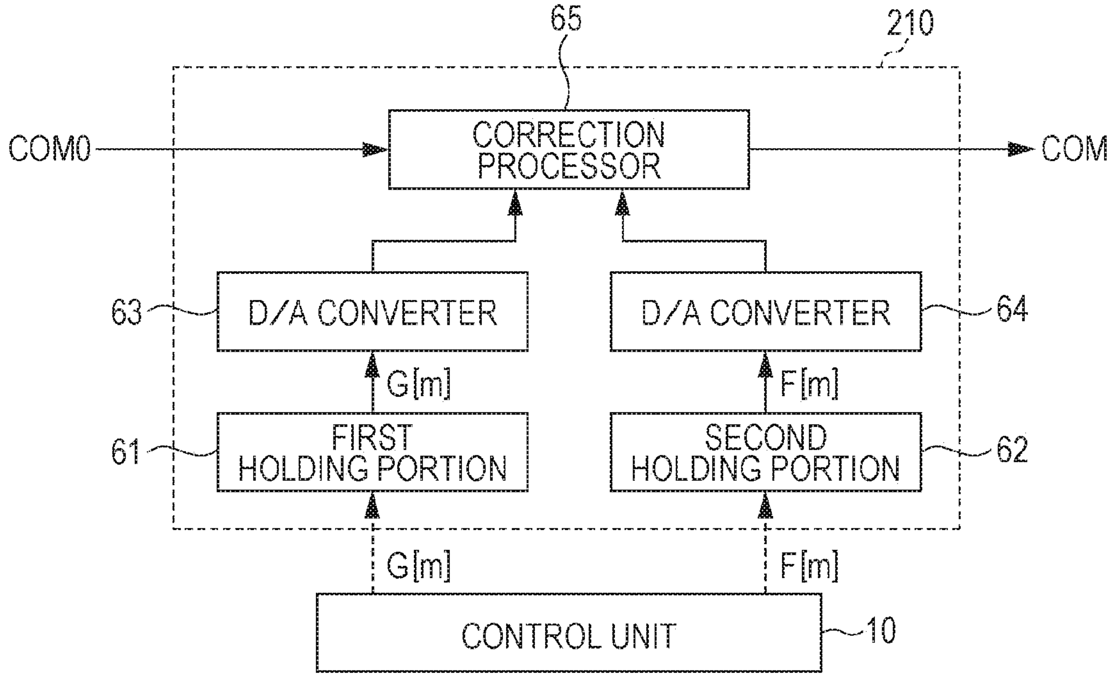
FIG. 3 is a block diagram showing a control signal correction portion.

FIG. 3 is a block diagram showing a control signal correction portion 210. As shown in FIG. 3, the control signal correction portion 210 of the present embodiment includes a first holding portion 61, a second holding portion 62, a D/A converter 63, a D/A converter 64, and a correction processor 65. The first holding portion 61 of the head unit U[m] holds a correction value G[m] and the second holding portion 62 of the head unit U[m] holds a correction value F[m]. That is, the correction value G[m] and the correction value F[m] are separately held by each of the M head units U[1] to U[M]. A nonvolatile memory such as, for example an EEPROM or a PROM (for example, a fuse ROM) is suitably employed as the first holding portion 61 and the second holding portion 62. The correction value G[m] and the correction value F[m] are sequentially supplied from the control unit 10 with respect to each of the M head units U[1] to U[M], for example during start up of the printing apparatus 100, and held by the first holding portion 61 and the second holding portion 62 of each head unit U[m]. The D/A converter 63 converts the correction value G[m] held by the first holding portion 61 from digital to analog, and the D/A converter 64 converts the correction value F[m] held by the second holding portion 62 from digital to analog.

The correction processor 65 is a variable gain amplifier that generates the control signal COM[m] by correcting the control signal COM0 supplied from the control unit 10 according to the correction value G[m] and the correction value F[m]. More specifically, the correction processor 65 corrects a reference voltage (voltage at the start point or end point of a printing period Ta) according to the correction value F[m], as well as correcting (amplitude correction) the amplitude of the control signal COM0 according to the correction value G[m]. That is, the correction value G[m] is a variable that indicates the gain of a control signal COM[m] with respect to the control signal COM0, and the correction value F[m] is a variable indicating the offset of a reference voltage of the control signal COM[m].

The correction value G[m] and the correction value F[m] are separately selected for each head unit U[m], for example, at the latter stage before shipment of the printing apparatus 100 so as to compensate for errors in the discharge amount of ink droplets caused by differences in the characteristics (for example, the conversion efficiency of the piezoelectric element 40) of the discharge portion group 24 for each head unit U[m]. Accordingly, the correction values G[1] to G[M] of each head unit U[m] are set to different numerical values and the correction values F[1] to F[M] of each head unit U[m] are set to different numerical values. More specifically, the correction value G[m] (G[1] to G[M]) and the correction value F[m] (F[1] to F[M]) are experimentally or statistically selected for each of the M head units U[1] to U[M] so that the variance in the discharge amount of ink droplets discharged in practice from the nozzle of each head unit U[m] in a case in which the same discharge amounts are designated in the printing data DP. For example, the correction value G[m] and the correction value F[m] are set to larger numerical values as the head unit U[m] has the smaller tendency for the deformation amount of the piezoelectric element 40 with respect to the applied voltage. As can be understood from the above description, the driving signal generator 22 of each of the M head units U[1] to U[M] functions as an element that generates a driving signal D from the control signal COM0 according to the characteristics (for example, the conversion efficiency of the piezoelectric element 40) of the discharge portion group 24 of the head unit U[m] and supplies the signal to each piezoelectric element 40 of the discharge portion group 24. The control signal correction portion 210 of each of the M head units U[1] to U[M] corresponds to an element that corrects the control signal COM0 according to the characteristics of the piezoelectric element 40 of the discharge portion group 24 (block) of the head unit U[m].

As shown in FIG. 4, two arbitrary head units U[m1] and U[m2] among the M head units U[1] to U[M] are focused on (m1, m2=1 to M, m1≠m2). In FIG. 4, a case in which the deformation amount (discharge amount of an ink droplet) when a predetermined voltage is applied to each piezoelectric element 40 of the head unit U[m1] is less than the deformation amount when the same voltage is applied to each piezoelectric element 40 of the head unit U[m2] (that is, the conversion efficiency of each piezoelectric element 40 of the head unit U[m1] is less than the conversion efficiency of each piezoelectric element 40 of the head unit U[m2]) is assumed.

As is understood from FIG. 4, the correction value G[m1] is set to a numerical value exceeding the correction value G[m2] such that the amplitude of the control signal COM [m1] of the head unit U[m1] exceeds the amplitude of the control signal COM[m2] of the head unit U[m2]. The correction value F[m1] and the correction value F[m2] are selected such that the reference voltage of the control signal COM[m1] and the reference voltage of the control signal COM[m2] match the reference voltage VC of the control signal COM0. Accordingly, the waveforms of the driving signal D (control signal COM[m1]) generated by the driving signal generator 22 of the head unit U[m1] in order for a predetermined amount of ink droplet to be discharged by each piezoelectric element 40 and the driving signal D (control signal COM[m2]) generated by the driving signal generator 22 of the head unit U[m2] in order for the same amount of ink droplet to be discharged by each piezoelectric element 40 are different.

As can be understood from the above description, in the present embodiment, because the control signal COM0 commonly supplied to the M head units U[1] to U[M] is separately corrected for each head unit U[m] according to the characteristics of the piezoelectric element 40 of each head unit U[m], the influence of differences in the characteristics of each piezoelectric element 40 of each head unit U[m] (for each block) is reduced compared to, for example, a configuration in which the control signal COM0 is supplied to the selector 230 without correction. More specifically, it is possible to reduce variance in the discharge amount of an ink droplet discharged in practice from the nozzle of each of M head units U[1] to U[M] in a case where the same discharge amount is designated by the printing data DP. In the above description, although a case in which the correction value G[m] and the correction value F[m] are different in each of the M head units U[1] to U[M] is provided as an example, the correction value G[m] and the correction value F[m] are set to the same numerical value in two or more head units U[m] in which the characteristics of the piezoelectric elements 40 are similar or common.

The method of instructing each head unit U[m] of the correction value G[m] and the correction value F[m] is arbitrary. For example, in the preceding description, although the correction value G[m] and the correction value F[m] are supplied to each of the M head units U[1] to U[M] from the control unit 10 during start up of the printing apparatus 100, it is possible for the correction value G[m] and the correction value F[m] to be supplied from an adjusting device (not shown) to each of the M head units U[1] to U[M] of the printing apparatus 100 and held by the first holding portion 61 and the second holding portion 62, for example, in the manufacturing process of the printing apparatus 100. A configuration in which the correction value G[m] and the correction value F[m] are held in a fixed manner in the head unit U[m], for example, by disconnecting or shorting of specific wirings (jumper wire) in the manufacturing process of the printing apparatus 100 may be employed. Moreover, depending on the configuration in which a signal instructing the correction value G[m] and the correction value F[m] is supplied in a fixed manner from the control unit 10 to each head unit U[m], it is possible to not include the first holding portion 61 and the second holding portion 62.

Driver

Figure 5:
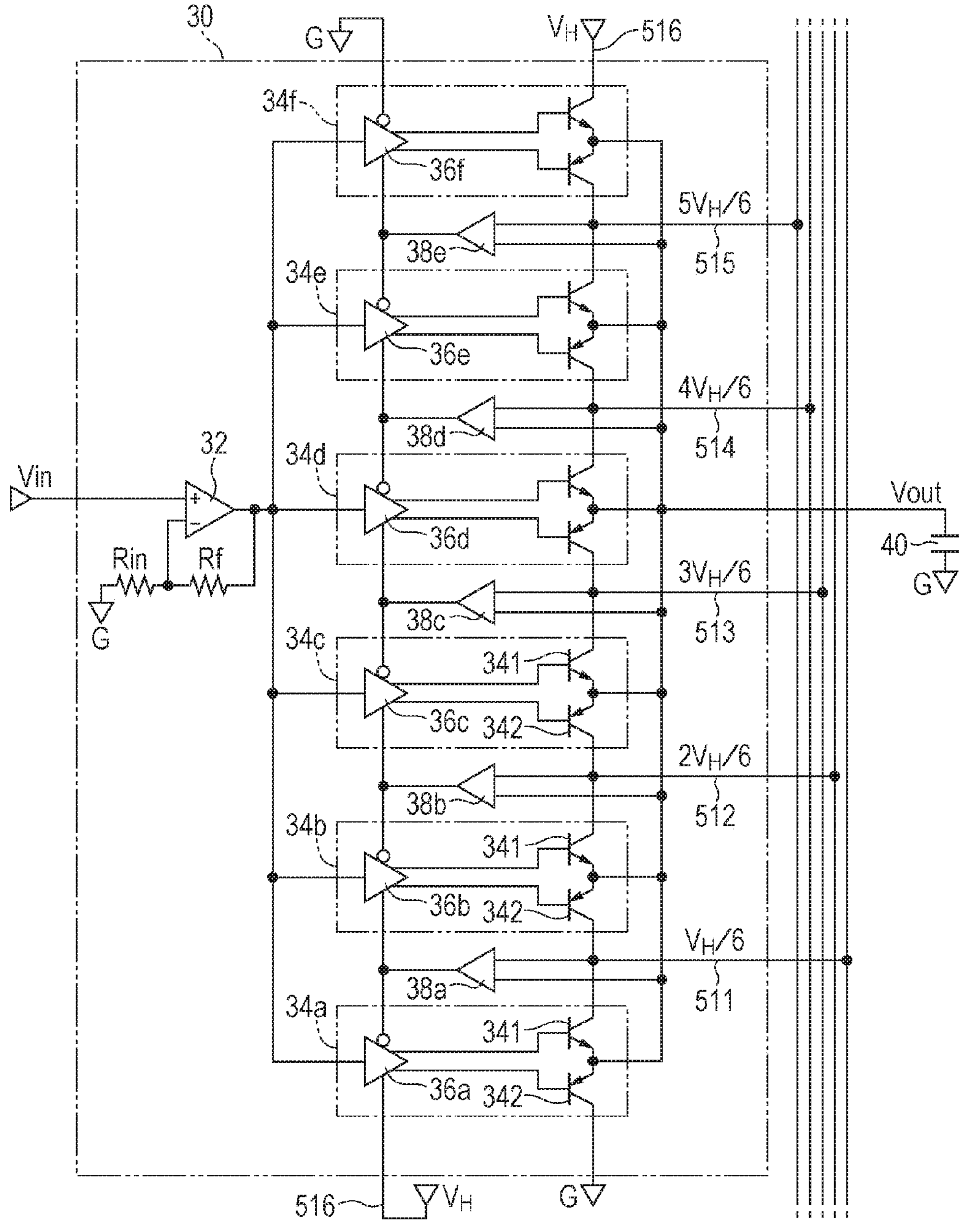
FIG. 5 is a diagram showing one example of a driver configuration in the print head.

FIG. 5 is a diagram showing an example of a configuration of a driver 30 that drives one piezoelectric element 40 in the present embodiment. As shown in FIG. 5, the driver 30 generates the voltage Vout (driving signal D) using seven types of voltage including a voltage zero, in more detail, in ascending order, the voltages zero (ground G), $V_H/6$, $2V_H/6$, $3V_H/6$, $4V_H/6$, $5V_H/6$, and $V_H$. The voltage $V_H/6$ is supplied to the driver 30 from the auxiliary power source portion 50 via a power source wiring 511, and similarly the voltages $2V_H/6$, $3V_H/6$, $4V_H/6$, and $5V_H/6$ are supplied to each driver 30 from the auxiliary power source portion 50 via the power source wirings 512, 513, 514, and 515. As shown in FIG. 5, the driver 30 includes an operational amplifier 32, unit circuits 34*a* to 34*f*, and comparators 38*a* to 38*e*, and drives the piezoelectric element 40 according to the control signal Vin.

The control signal Vin output from the selector 230 is supplied to the input end (+) of the operational amplifier 32 that is the input end of the driver 30. The output signal of the operational amplifier 32 is negatively fed back to the input end (−) of the operational amplifier 32 via a resistance Rf, and further grounded to the ground G via a resistance Rin, along with being supplied to each of the unit circuits 34*a* to 34*f*. Therefore, the operational amplifier 32 performs non-inverting amplification by (1+Rf/Rin) on the control signal Vin.

Although the voltage amplification rate of the operational amplifier 32 can be set according to the resistances Rf and Rin, for the sake of convenience, hereinafter, Rf is set to zero, and Rin is infinite. That is, hereinafter, description with be made in which the voltage amplification rate of the operational amplifier 32 is set to “1”, and the control signal Vin is supplied as is to the unit circuits 34*a* to 34*f*. The voltage amplification rate may be a value other than “1”.

The unit circuits 34*a* to 34*f* are provided in ascending order of the voltage corresponding to two adjacent voltages among the seven types of voltage. In more detail, the unit circuit 34*a* is provided corresponding to the voltage zero and the voltage $V_H/6$, the unit circuit 34*b* corresponding to the voltage $V_H/6$ and the voltage $2V_H/6$, the unit circuit 34*c* corresponding to the voltage $2V_H/6$ and voltage $3V_H/6$, the unit circuit 34*d* corresponding to the voltage $3V_H/6$ and the voltage $4V_H/6$, the unit circuit 34*e* corresponding to the voltage $4V_H/6$ and the voltage $5V_H/6$ and the unit circuit 34*f* corresponding to the voltage $5V_H/6$ and the voltage $V_H$.

The unit circuits 34*a* to 34*f* have the same configuration as one another, and include one corresponding to any one of the level shifters 36*a* to 36*f*, a bipolar-type NPN-type transistor 341 and a bipolar-type PNP-type transistor 342.

The unit circuits 34*a* to 34*f* will be described by the simple reference “34” when generally described without being specified, and similarly, the level shifters 36*a* to 36*f* will be described by the simple reference “36” when generally described without being specified.

The level shifter 36 enters either of an enable state or a disable state. In more detail, the level shifter 36 enters the enable state when a signal supplied to the negative control end to which a round mark is applied has an L level, and a signal supplied to a positive control end to which a round mark is not applied has an H level, and enters a disable state at other times.

The comparators 38*a* to 38*e* have a one to one correspondence with five types of voltage of the seven types of voltage as described later with the exception of the voltage zero and the voltage $V_H$. When a given unit circuit 34 is focused on, the output signal of the comparator corresponded to the high order side voltage from the two voltages corresponding to the unit circuit 34 is supplied to the negative control end of the level shifter 36 in the unit circuit 34, and the output signal of the comparator corresponded to the low order side voltage from the two voltages corresponding to the unit circuit is supplied to the positive control end of the level shifter 36. However, the negative control end of the level shifter 36*f* in the unit circuit 34*f* is grounded to the ground G of the voltage zero corresponding to the L level, whereas the positive control end of the level shifter 36*a* in the unit circuit 34*a* is connected to the power source wiring 516 that supplies the voltage $V_H$ corresponding to the H level.

The level shifter 36 supplies the voltage of the input control signal Vin shifted by a predetermined value to the negative side to the base terminal of the transistor 341, whereas the voltage of the control signal Vin is shifted by a predetermined value to the positive side and supplied to the base terminal of the transistor 342 in the enable state. The level shifter 36 supplies a voltage by which the transistor 342 is turned off, for example the voltage zero, to the base terminal of the transistor 342 along with supplying a voltage by which the transistor 341 is turned off, for example the voltage $V_H$, to the base terminal of the transistor 341, irrespective of the control signal Vin, in the disable state.

The predetermined value is set to a voltage (bias voltage, approximately 0.6 volts) between the base and emitter at which a current begins to flow to the emitter terminal. Therefore, the predetermined value is a quality determined according to the characteristics of the transistors 341 and 342, and is zero if the transistors 341 and 342 are ideal.

The collector terminal of the transistor 341 is connected to the power source wiring that supplies the high order side voltage from the corresponding two voltages, and the collector terminal of the transistor 342 is connected to the power source wiring that supplies the low order side voltage. For example, in the unit circuit 34*a* corresponding to the voltage zero and the voltage $V_H/6$, the collector terminal of the transistor 341 is connected to the power source wiring 511 that supplies the voltage $V_H/6$, and the collector terminal of the transistor 342 is grounded to the ground G of the voltage zero. For example, in the unit circuit 34*b* corresponding to the voltage $V_H/6$ and voltage $2V_H/6$, the collector terminal of the transistor 341 is connected to the power source wiring 512 that supplies the voltage $2V_H/6$, and the collector terminal of the transistor 342 is connected to the power source wiring 511 that supplies the voltage $V_H/6$. In the unit circuit 34*f* corresponding to the voltage $5V_H/6$ and voltage $V_H$, the collector terminal of the transistor 341 is connected to the power source wiring 516 that supplies the voltage $V_H$, and the collector terminal of the transistor 342 is connected to the power source wiring 515 that supplies the voltage $5V_H/6$.

Meanwhile, the respective emitter terminals of the transistors 341 and 342 in the unit circuits 34*a* to 34*f* are commonly connected to one end of the piezoelectric element 40. Therefore, the common connection point of the respective emitter terminals of the transistors 341 and 342 as described above is connected to one end of the piezoelectric element 40 as an output end of the driver 30.

The comparators 38*a* to 38*e* compare the levels of voltages corresponding to the five types of voltage, voltage $V_H/6$, $2V_H/6$, $3V_H/6$, $4V_H/6$ and $5V_H/6$, from the above seven types of voltage with the exception of the voltage zero and the voltage $V_H$ and supplied to the two input terminals, and output a signal that shows the comparison results. One end of the two input ends in the comparators 38*a* to 38*e* is connected to the power source wiring that supplies the voltage corresponding to itself, and the other end is commonly connected to one end of the piezoelectric element 40 along with the respective emitter terminals of the transistors 341 and 342. For example, for the comparator 38*a* corresponding to the voltage $V_H/6$, one end of the two input ends is connected to the power source wiring 511 that supplies the voltage $V_H/6$ corresponding to itself, and further, for example, for the comparator 38*b* corresponding to the voltage $2V_H/6$, one end of the two input ends is connected to the power source wiring 512 that supplies the voltage $2V_H/6$ corresponding to itself.

Each of the comparators 38*a* to 38*e* outputs a signal set to the H level if the voltage Vout of the other end in the input end is the voltage of the one end or higher, and set to the L level if the voltage Vout is less than the voltage of the one end.

More specifically, the comparator 38*a* outputs a signal set to the H level if the voltage Vout is the voltage $V_H/6$ or higher, and set to the L level if the voltage Vout is less than the voltage $V_H/6$. For example, the comparator 38*b* outputs a signal set to the H level if the voltage Vout is the voltage $2V_H/6$ or higher, and set to the L level if the voltage Vout is less than the voltage $2V_H/6$.

When one of the five types of voltage is focused on, the output signal of the comparator corresponding to the voltage focused on is supplied to each of the negative input terminal of the level shifter 36 of the unit circuit that sets the voltage to a high order side voltage and the positive input end of the level shifter 36 of the unit circuit that sets the voltage to a low order side voltage.

For example, the output signal of the comparator 38*a* corresponding to the voltage $V_H/6$ is supplied to each of the negative input end of the level shifter 36*a* of the unit circuit 34*a* corresponding to the voltage $V_H/6$ as the high order side voltage, and the positive input end of the level shifter 36*b* of the unit circuit 34*b* corresponding to the voltage $V_H/6$ as the low order side voltage. In addition, for example, the output signal of the comparator 38*b* corresponding to the voltage $2V_H/6$ is supplied to each of the negative input end of the level shifter 36*b* of the unit circuit 34*b* corresponding to the voltage $2V_H/6$ as the high order side voltage, and the positive input end of the level shifter 36*c* of the unit circuit 34*c* corresponding to the voltage $2V_H/6$ as the low order side voltage.

Next, the operation of the driver 30 will be described.

First, what state the comparators 38*a* to 38*e* and the level shifters 36 enter with respect to voltage Vout held by the piezoelectric element 40 will be described.

The output signals of the comparators 38*a* to 38*e* all become the L level in a state (first state) in which the voltage Vout is the voltage zero or higher and less than the voltage $V_H/6$. Therefore, in the first state, only the level shifter 36*a* enters the enable state, and the other level shifters 36*b* to 36*f* enter the disable state.

In a state (second state) in which the voltage Vout is the voltage $V_H/6$ or higher and less than the voltage $2V_H/6$, the output signal of the comparator 38*a* becomes the H level and the output signals of the other comparators 38*b* to 38*e* become the L level. Therefore, in the second state, only the level shifter 36*b* enters the enable state, and the other level shifters 36*a*, and 36*c* to 36*f* enter the disable state.

In a state (third state) in which the voltage Vout is the voltage $2V_H/6$ or higher and less than the voltage $3V_H/6$, the output signals of the comparators 38*a* and 38*b* become the H level and the output signals of the other comparators 38*c* to 38*e* become the L level. Therefore, in the third state, only the level shifter 36*c* enters the enable state, and the other level shifters 36*a*, 36*b*, and 36*d* to 36*f* enter the disable state.

In a state (fourth state) in which the voltage Vout is the voltage $3V_H/6$ or higher and less than the voltage $4V_H/6$, the output signals of the comparators 38*a*, 38*b*, and 38*c* become the H level and the output signals of the other comparators 38*d* and 38*e* become the L level. Therefore, in the fourth state, only the level shifter 36*d* enters the enable state, and the other level shifters 36*a* to 36*c*, 36*e*, and 36*f* enter the disable state.

In a state (fifth state) in which the voltage Vout is the voltage $4V_H/6$ or higher and less than the voltage $5V_H/6$, the output signals of the comparators 38*a* to 38*d* become the H level and the output signal of the other comparator 38*e* become the L level. Therefore, in the fifth state, only the level shifter 36*e* enters the enable state, and the other level shifters 36*a* to 36*d*, and 36*f* enter the disable state.

In a state (sixth state) in which the voltage Vout is the voltage $5V_H/6$ or higher and less than the voltage $V_H$, the output signals of the comparators 38*a* to 38*e* all become the H level. Therefore, in the sixth state, only the level shifter 36*f* enters the enable state, and the other level shifters 36*a* to 36*e* enter the disable state.

In this way, only the level shifter 36*a* enters the enable state in the first state, and thereafter, similarly, only the level shifter 36*b* in the second state, only the level shifter 36*c* in the third state, only the level shifter 36*d* in the fourth state, only the level shifter 36*e* in the fifth state, and only the level shifter 36*f* in the sixth state enter the enable state.

The first state to the sixth state are regulated by the voltage Vout; however, it can be said in other words that the state is the state of the charge held (stored) in the piezoelectric element 40.

In the first state, when the level shifter 36*a* is in the enable state, the level shifter 36*a* supplies a voltage signal in which the control signal Vin is level shifted by a predetermined value in the negative direction to the base terminal of the transistor 341 in the unit circuit 34*a*, and supplies a voltage signal in which the control signal Vin is level shifted by a predetermined value in the positive direction to the base terminal of the transistor 342 in the unit circuit 34*a*.

When the voltage of the control signal Vin is higher than the voltage Vout (connection point voltage of the emitter terminals), the current according to the difference (voltage between the base and emitter; strictly speaking, voltage reduced by a predetermined value from the voltage between the base and emitter) flows from the collector terminal of the transistor 341 to the emitter terminal. Therefore, the voltage Vout slowly rises and approaches the voltage of the control signal Vin, and finally, when the voltage Vout matches the voltage of the control signal Vin, at this point in time the current flowing to the transistor 341 becomes zero.

Meanwhile, when the voltage of the control signal Vin is lower than the voltage Vout, a current according to the difference flows from the emitter terminal of the transistor 342 to the collector terminal. Therefore, the voltage Vout slowly lowers and approaches the voltage of the control signal Vin, and finally, when the voltage Vout matches the voltage of the control signal Vin, at this point in time the current flowing to the transistor 342 becomes zero.

Accordingly, in the first state, the transistors 341 and 342 of the unit circuit 34*a* execute control such that the voltage Vout matches the control signal Vin.

In the first state, since the level shifters 36 in the unit circuits 34*b* to 34*f* other than the unit circuit 34*a* are in the disable state, the voltage $V_H$ is supplied to the base terminal of the transistor 341, and the voltage zero is supplied to the base terminal of the transistor 342. Therefore, in the first state, in the unit circuits 34*b* to 34*f*, since the transistors 341 and 342 are turned off, the transistors do not contribute to the control of the voltage Vout.

Although the first state is described here, the operations are the same for the second state to the sixth state. More specifically, the transistors 341 and 342 of the unit circuit that becomes effective control the voltage Vout to match the control signal Vin along with any of the unit circuits 34*a* to 34*f* becoming effective according to the voltage Vout held by the piezoelectric element 40. Therefore, when viewing the driver 30 as a whole, the voltage Vout operates to track the voltage of the control signal Vin.

Figure 6A:
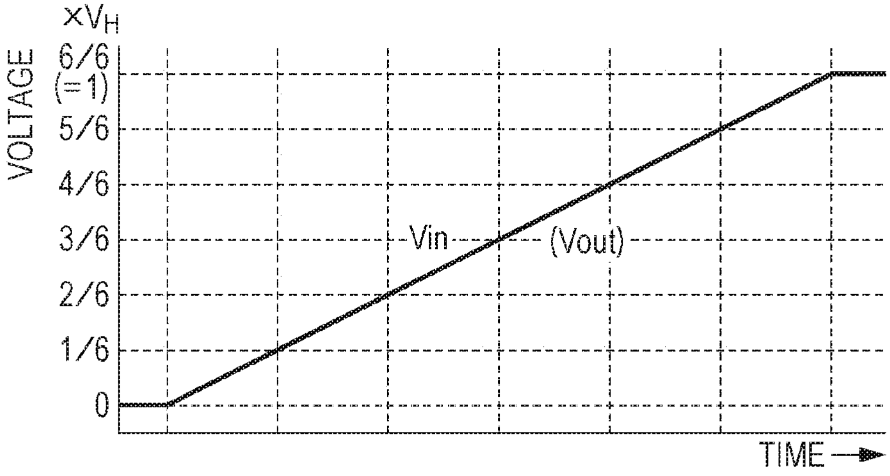
FIGS. 6A and 6B are operational explanatory diagrams of a driver.
Figure 6B:
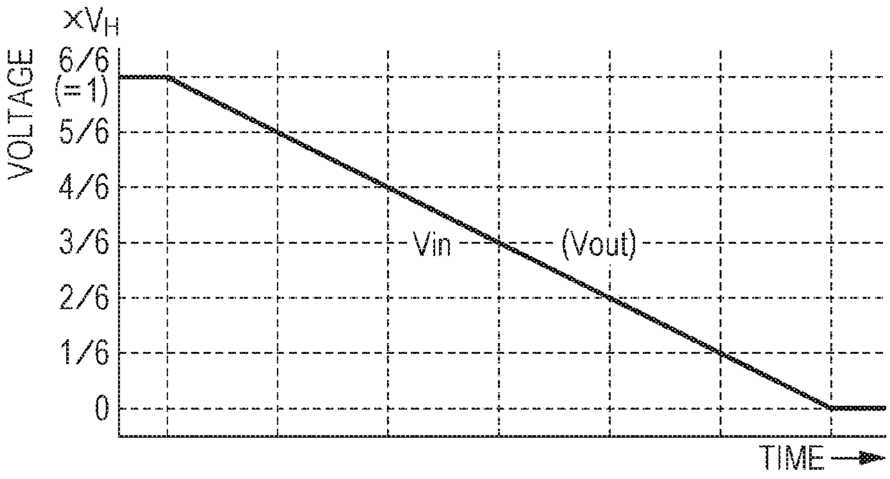

Accordingly, as shown in FIG. 6A, when the control signal Vin rises from, for example, the voltage zero to the voltage $V_H$, the voltage Vout changes from the voltage zero to the voltage $V_H$ tracking the control signal Vin. As shown in FIG. 6B, when the control signal Vin lowers from the voltage $V_H$ to the voltage zero, the voltage Vout also changes from the voltage $V_H$ to the voltage zero tracking the control signal Vin.

Figure 7A:
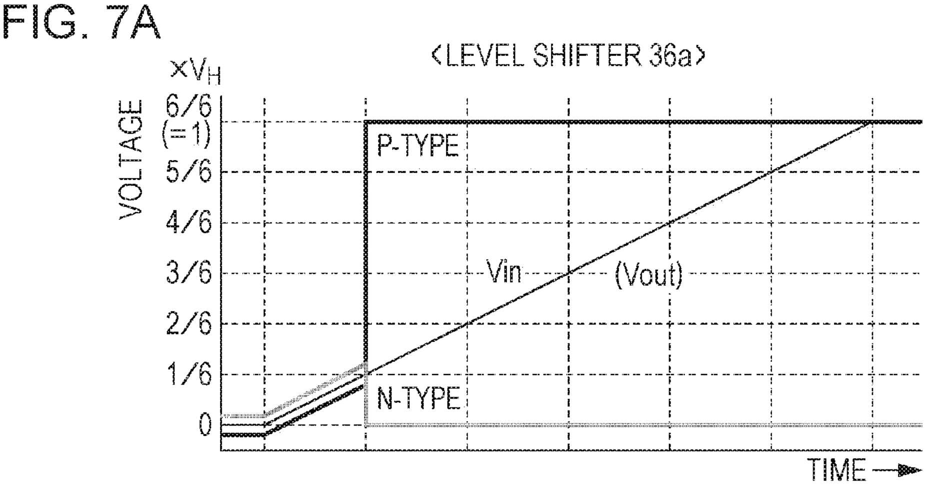
FIGS. 7A to 7C are operational explanatory diagrams of a level shifter in the driver.
Figure 7B:
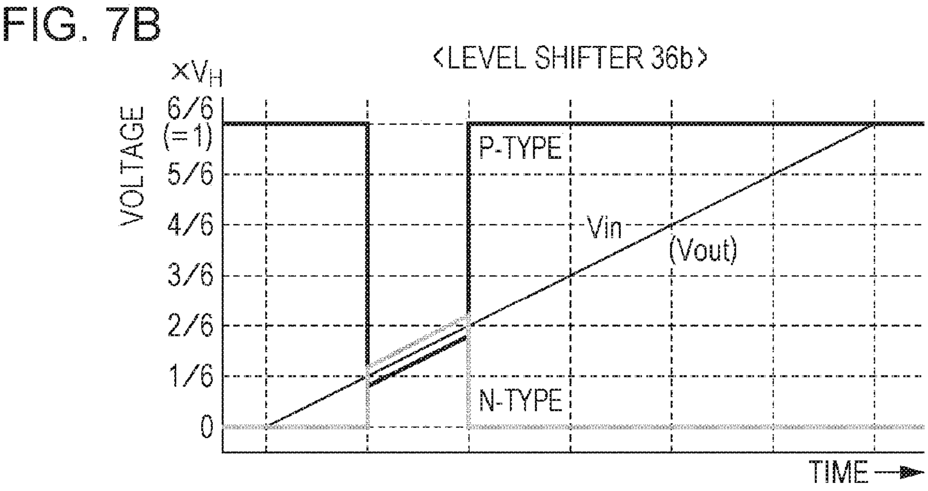
Figure 7C:
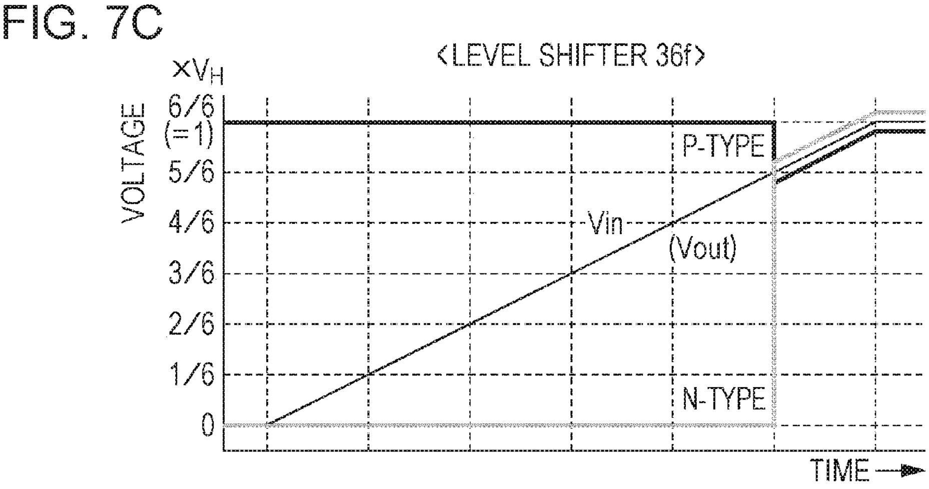

FIGS. 7A to 7C are diagrams for describing the operation of the level shifter.

When the voltage of the control signal Vin changes by rising from the voltage zero to the voltage $V_H$, the voltage Vout also rises tracking the control signal Vin. In the rising step, during the first state in which the voltage Vout is the voltage zero or higher and less than the voltage $V_H/6$, the level shifter 36*a* is in the enable state. Therefore, as shown in FIG. 7A, the voltage (represented by "p-type") supplied to the base terminal of the transistor 341 by the level shifter 36*a* becomes a voltage in which the control signal Vin is shifted by a predetermined value in the negative direction, and the voltage (represented by "n-type") supplied to the base terminal of the transistor 342 becomes a voltage in which the control signal Vin is shifted by a predetermined value in the positive direction. Meanwhile, since the level shifter 36*a* enters the disable state at times other than the first state, the voltage supplied to the base terminal of the transistor 341 becomes $V_H$, and the voltage supplied to the base terminal of the transistor 342 becomes zero.

FIG. 7B shows a voltage waveform output by the level shifter 36*b*, and FIG. 7C shows a voltage waveform output by the level shifter 36*f*. If attention is paid to the fact that the level shifter 36*b* enters the enable state during the second state in which the voltage Vout is the voltage $V_H/6$ or higher and less than the voltage $2V_H/6$, and the level shifter 36*f* enters the enable state during the sixth state in which the voltage Vout is the voltage $5V_H/6$ or higher and less than the voltage $V_H$, no special description is necessary.

Description of the operation of the level shifters 36*c* to 36*e* in the rising step of the voltage of the control signal Vin (or the voltage Vout) or description of the operation of the level shifters 36*a* to 36*f* in the falling step of the voltage of the control signal Vin (or the voltage Vout) will not be made.

Next, the flow of current (charge) in the unit circuits 34*a* to 34*f* will be described taking unit circuits 34*a* and 34*b* as an example, and separating charging and discharging.

Figure 8:
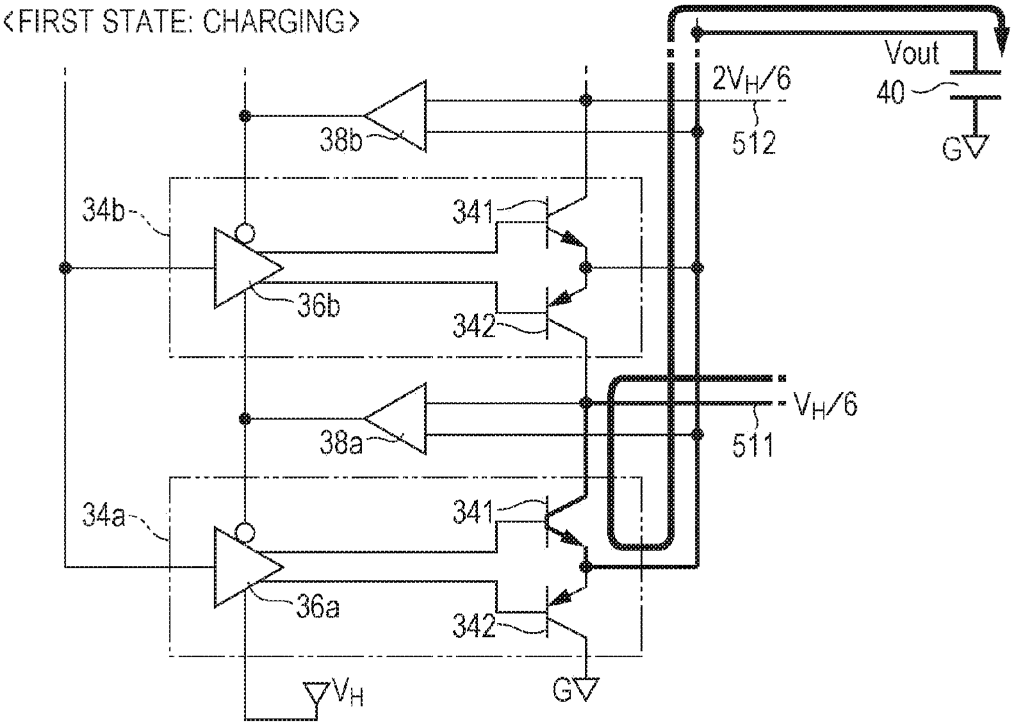
FIG. 8 is a diagram for describing the flow of current (charge) in the driver.

FIG. 8 is a diagram showing the operation when the piezoelectric element 40 is charged during the first state (state in which the voltage Vout is the voltage zero or higher and less than the voltage $V_H/6$).

In the first state, since the level shifter 36*a* enters the enable state, and the other level shifters 36*b* to 36*f* enter the disable state, it is sufficient to focus on only the unit circuit 34*a*.

When the voltage of the control signal Vin is higher than the voltage Vout in the first state, the transistor 341 of the unit circuit 34*a* causes a current to flow according to the voltage between the base and emitter. Accordingly, the transistor 341 of the unit circuit 34*a* functions as a first transistor. At this time, the transistor 342 of the unit circuit 34*a* is off.

At this time, the current flows in a path from the power source wiring 511 via the transistor 341 (of unit circuit 34*a*) to the piezoelectric element 40 as shown by the arrow in the drawing, and the piezoelectric element 40 is charged by a charge. The voltage Vout rises due to this charging.

When the voltage Vout matches the voltage of the control signal Vin, since the transistor 341 of the unit circuit 34*a* is off, charging to the piezoelectric element 40 stops.

Meanwhile, in a case in which the control signal Vin rises to the voltage $V_H/6$ or higher, since the voltage Vout also tracks the control signal Vin, the voltage Vout becomes the voltage $V_H/6$ or higher and transitions from the first state to the second state (state in which the voltage Vout is the voltage $V_H/6$ or higher and less than the voltage $2V_H/6$).

Figure 9:
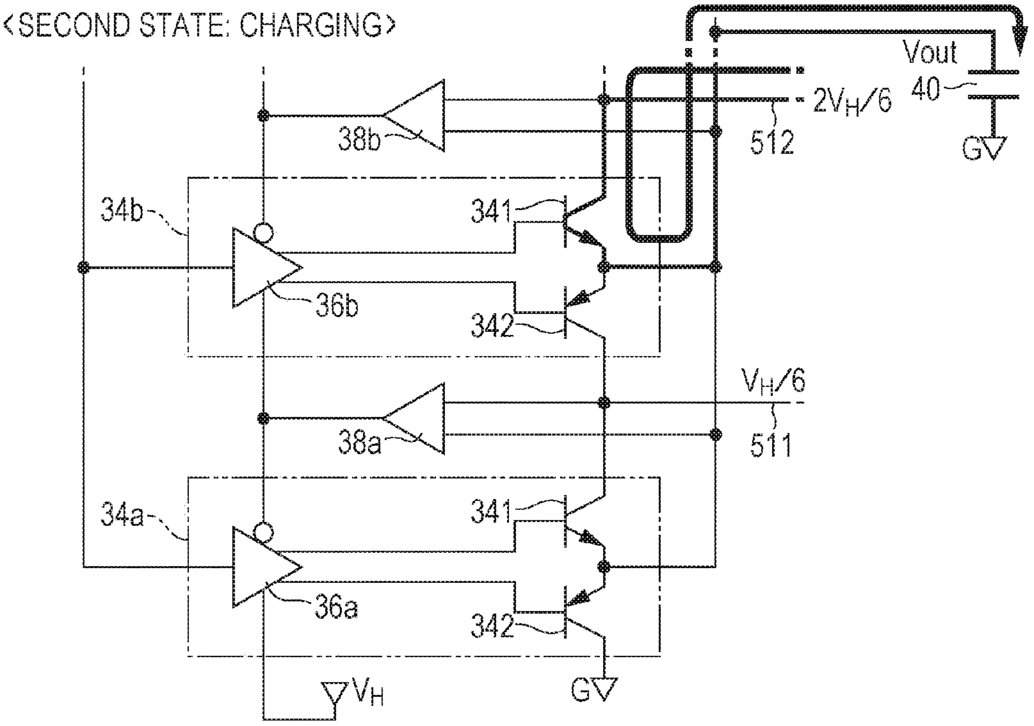
FIG. 9 is a diagram for describing the flow of current (charge) in the driver.

FIG. 9 is a diagram showing the operation when the piezoelectric element 40 is charged in the second state.

In the second state, since the level shifter 36*b* enters enable state and the other level shifters 36*a*, and 36*c* to 36*f* enter the disable state, it is sufficient to focus on only the unit circuit 34*b*.

When the voltage of the control signal Vin is higher than the voltage Vout in the second state, a current flows according to the voltage between the base and emitter of the transistor 341 of the unit circuit 34*b*. Accordingly, the transistor 341 of the unit circuit 34*b* functions as a third transistor. At this time, the transistor 342 of the unit circuit 34*b* is off.

At this time, the current flows in a path from the power source wiring 512 via the transistor 341 (of unit circuit 34*b*) to the piezoelectric element 40 as shown by the arrow in the drawing, and the piezoelectric element 40 is charged by a charge. That is, in a case in which the piezoelectric element 40 is charged in the second state, one end of the piezoelectric element 40 is electrically connected to the auxiliary power source portion 50 via the power source wiring 512.

In this way, when the voltage transitions from the first state to the second state during rising of the voltage Vout, the supply origin of the current switches from the power source wiring 511 to the power source wiring 512.

When the voltage Vout matches the voltage of the control signal Vin, since the transistor 341 of the unit circuit 34*b* is off, charging to the piezoelectric element 40 stops.

Meanwhile, in a case in which the control signal Vin rises to the voltage $2V_H/6$ or higher, since the voltage Vout also tracks the control signal Vin, the voltage Vout becomes the voltage $2V_H/6$ or higher and transitions from the second state to the third state (state in which the voltage Vout is the voltage $2V_H/6$ or higher and less than the voltage $3V_H/6$).

For the charging operations from the third state to the sixth state, although not specifically shown in the drawings, the supply origin of the current switches in a stepwise manner to power source wirings 513, 514, 515 and 516.

Figure 10:
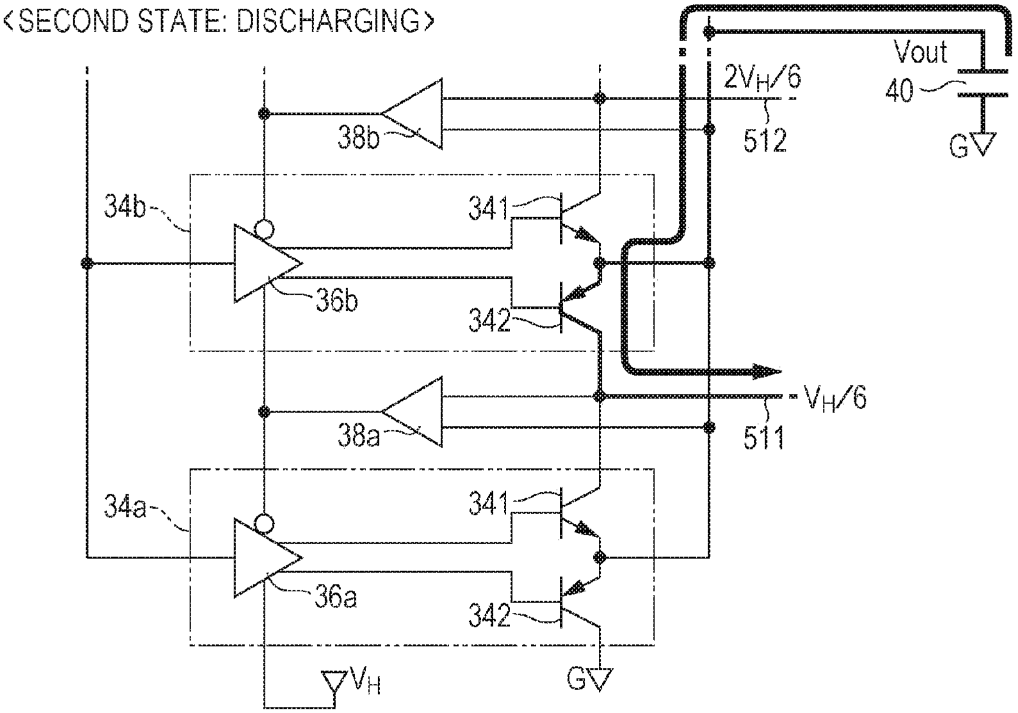
FIG. 10 is a diagram for describing the flow of current (charge) in the driver.

FIG. 10 is a diagram showing the operation when the piezoelectric element 40 is discharged when in the second state.

In the second state, the level shifter 36*b* enters the enable state. When the voltage of the control signal Vin is lower than the voltage Vout in this state, a current flows according to the voltage between the base and emitter of the transistor 342 of the unit circuit 34*b*. Accordingly, the transistor 341 of the unit circuit 34*b* functions as a second transistor. At this time, the transistor 341 of the unit circuit 34*b* is off.

At this time, the current flows in a path from the piezoelectric element 40 via the transistor 342 (of unit circuit 34*b*) to the power source wiring 511 as shown by the arrow in the drawing, and the charge is discharged from the piezoelectric element 40. That is, in a case in which the piezoelectric element 40 is charged by a charge in the first state, and in a case in which a charge is discharged from the piezoelectric element 40 in the second state, one end of the piezoelectric element 40 is electrically connected to the auxiliary power source portion 50 via the power source wiring 511. The power source wiring 511 supplies a current (charge) during charging in the first state, and recovers current (charge) during discharging in the second state.

The recovered charge is redistributed and reused by the auxiliary power source portion 50 described later.

When the voltage Vout matches the voltage of the control signal Vin, since the transistor 342 of the unit circuit 34*b* is off, discharging of the piezoelectric element 40 stops.

Meanwhile, in a case in which the control signal Vin drops to less than the voltage $V_H/6$, since the voltage Vout also tracks the control signal Vin, the voltage Vout becomes less than the voltage $V_H/6$ and transitions from the second state to the first state.

Figure 11:
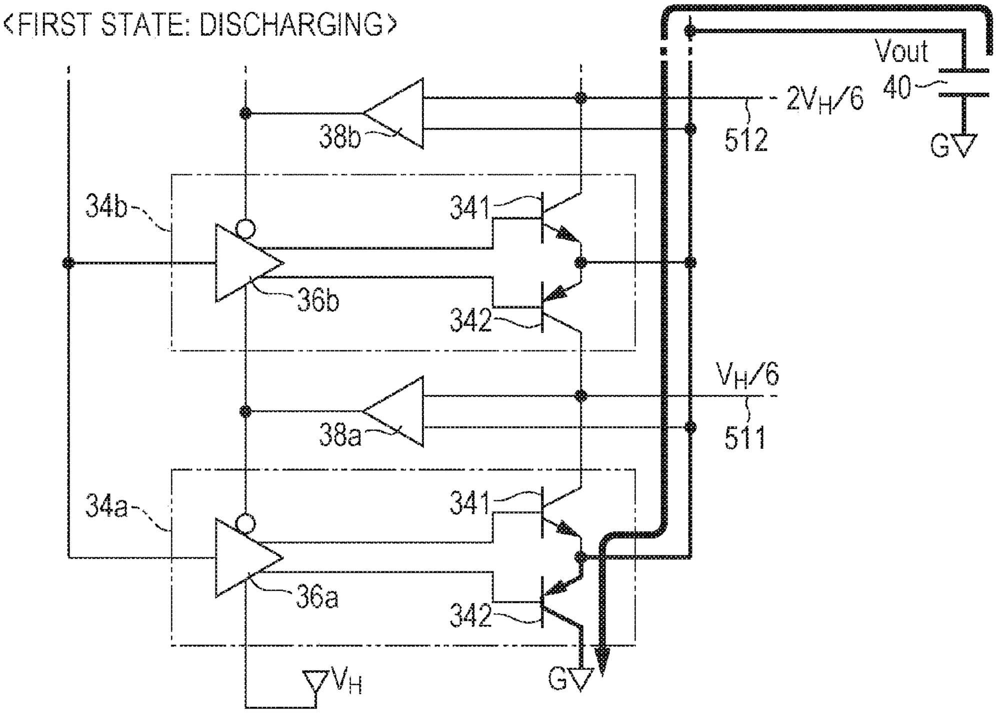
FIG. 11 is a diagram for describing the flow of current (charge) in the driver.

FIG. 11 is a diagram showing the operation when the piezoelectric element 40 is discharged during the first state.

In the first state, the level shifter 36*a* enters the enable state. In this state, when the control signal Vin is lower than the voltage Vout, a current flows according to the voltage between the base and emitter of the transistor 342 of the unit circuit 34*a*.

At this time, the transistor 341 of the unit circuit 34*a* is off.

At this time, the current flows in a path from the piezoelectric element 40 via the transistor 342 (of unit circuit 34*a*) to the ground G as shown by the arrow in the drawing, and the charge is discharged from the piezoelectric element 40.

Here, although description has been made taking the unit circuits 34*a* and 34*b* as an example and separating the charging and discharging, the unit circuits 34*c* to 34*f* have substantially the same operation with the exception of the transistors 341 and 342 that control the current being different.

That is, the power source wiring 512 supplies a current (charge) during charging in the second state, and recovers current (charge) during discharging in the third state, the power source wiring 513 supplies a current (charge) during charging in the third state, and recovers current (charge) during discharging in the fourth state, the power source wiring 514 supplies a current (charge) during charging in the fourth state, and recovers current (charge) during discharging in the fifth state, the power source wiring 515 supplies a current (charge) during charging in the fifth state, and recovers current (charge) during discharging in the sixth state, the power source wiring 516 supplies a current (charge) during charging in the sixth state, and the recovered charge is redistributed and reused by the auxiliary power source portion 50.

In the discharge path and the charge path in each state, the path from one end of the piezoelectric element 40 to the connection point of each emitter terminal in the transistors 341 and 342 is shared.

Generally, the capacity of a capacitive load such as the piezoelectric element 40 is C, the energy P stored in the capacitive load when the voltage amplitude is E is represented by $$P=(C \sim E^2)/2.$$

Although the piezoelectric element 40 works by deforming according to the energy P, the work amount in which ink is caused to be discharged is 1% or lower with respect to the energy P. Accordingly, the piezoelectric element 40 may be regarded as a simple capacity. When the capacity C is charged by a fixed power source, the same energy as $(C \sim E^2)/2$ is consumed by a charge circuit. When discharged, the same energy is also consumed by a discharge circuit.

Advantage of Driver

Figure 12A:
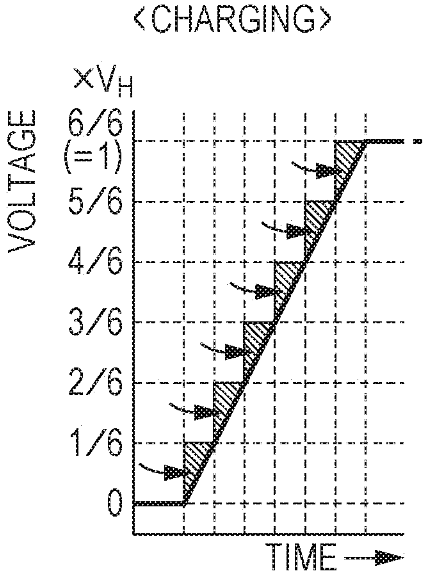
FIGS. 12A and 12B are explanatory diagrams of loss during charging and discharging of the driver.

In the present embodiment, when charged from the voltage zero to the voltage $V_H$, the piezoelectric element 40 is charged through six stages of from voltage zero to voltage $V_H/6$, from voltage $V_H/6$ to voltage $2V_H/6$, from voltage $2V_H/6$ to voltage $3V_H/6$, from voltage $3V_H/6$ to voltage $4V_H/6$, from voltage $4V_H/6$ to voltage $5V_H/6$, and from voltage $5V_H/6$ to voltage $V_H$. Therefore, during charging in the embodiment, there is only loss corresponding to the area of the hatched region in FIG. 12A. More specifically, the loss during charging in the piezoelectric element 40 in the embodiment is only $6/36$ (=16.7%) compared to the linear amplification that charges from the voltage zero to the voltage $V_H$ all at once.

Figure 12B:
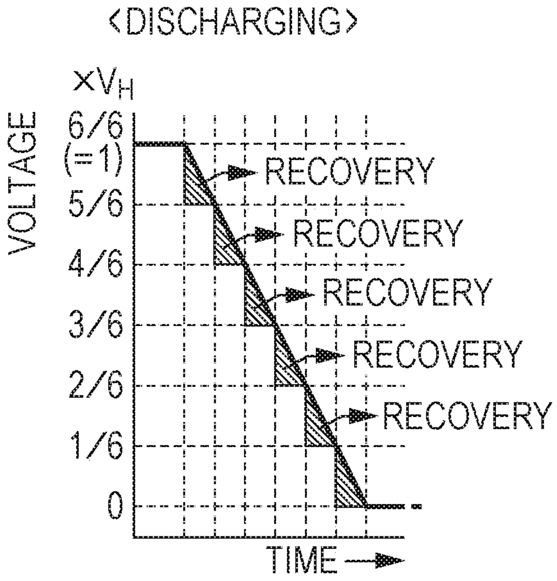

Meanwhile, in the present embodiment, since the loss during discharging also becomes stepwise, the loss during discharging is similarly only $6/36$ (=16.7%) as an amount that corresponds to the area of the hatched region in FIG. 12B, compared to the linear method that discharges from the voltage $V_H$ to the voltage zero all at once.

However, in the present embodiment, except for a case of discharging from the voltage $V_H/6$ to voltage zero, since the appropriated charges as the loss during discharging are redistributed and reused by being recovered by the auxiliary power source portion 50 described later, it is possible to achieve further reductions in power consumption.

In a class D amplifier, the energy efficiency is high compared to linear amplification. The reason is that because the output stage active element operates in a saturation state, electric power is almost unconsumed, loss such as in linear amplification does not occur in charging by conversion of magnetic energy due to an inductor L that configures a robust filter and energy due to the capacity C, and the current is regenerated to the power source by current switching during discharging.

However, in a practical class D amplifier, problems arise in that the resistance of an output stage active element is not zero in the saturation state, the magnetic field leaks, loss occurs due to the resistance component of the injector L, and there are cases where the inductor L is saturated during modulation.

In a class D amplifier, there are further problems in that waveform quality is poor and EMI countermeasures are necessary. Although the waveform quality may be improved by adding a dummy capacity or a filter, this leads to increases in power consumption by portions added or cost increases. For the EMI, a fundamental problem of switching in the class D amplifier arises. That is, when switched, not only does the current flowing when on become from several times to approximately 10 times compared to that of linear amplification, but the amount of the accompanying irradiated magnetic field also increases. Addition of a filter for EMI countermeasures becomes necessary, and the costs increase.

In the driver 30 of the printing apparatus 100 according to the embodiment, since the transistors 341, 342 that correspond to the output stage do not switch as in a class D amplifier, and further since an inductor L is not used, the problems of the waveform quality being poor or EMI countermeasures being necessary do not occur.

In the embodiment, since the voltage Vout operates tracking the voltage of the control signal Vin, control with respect to the piezoelectric element 40 is possible with a fine voltage. That is, the initial voltage and final voltage of the voltage Vout applied to the piezoelectric element 40 are not related to the voltages $V_H/6$, $2V_H/6$, $3V_H/6$, $4V_H/6$ and $5V_H/6$ using in driving.

Auxiliary Power Source Portion

Figure 13:
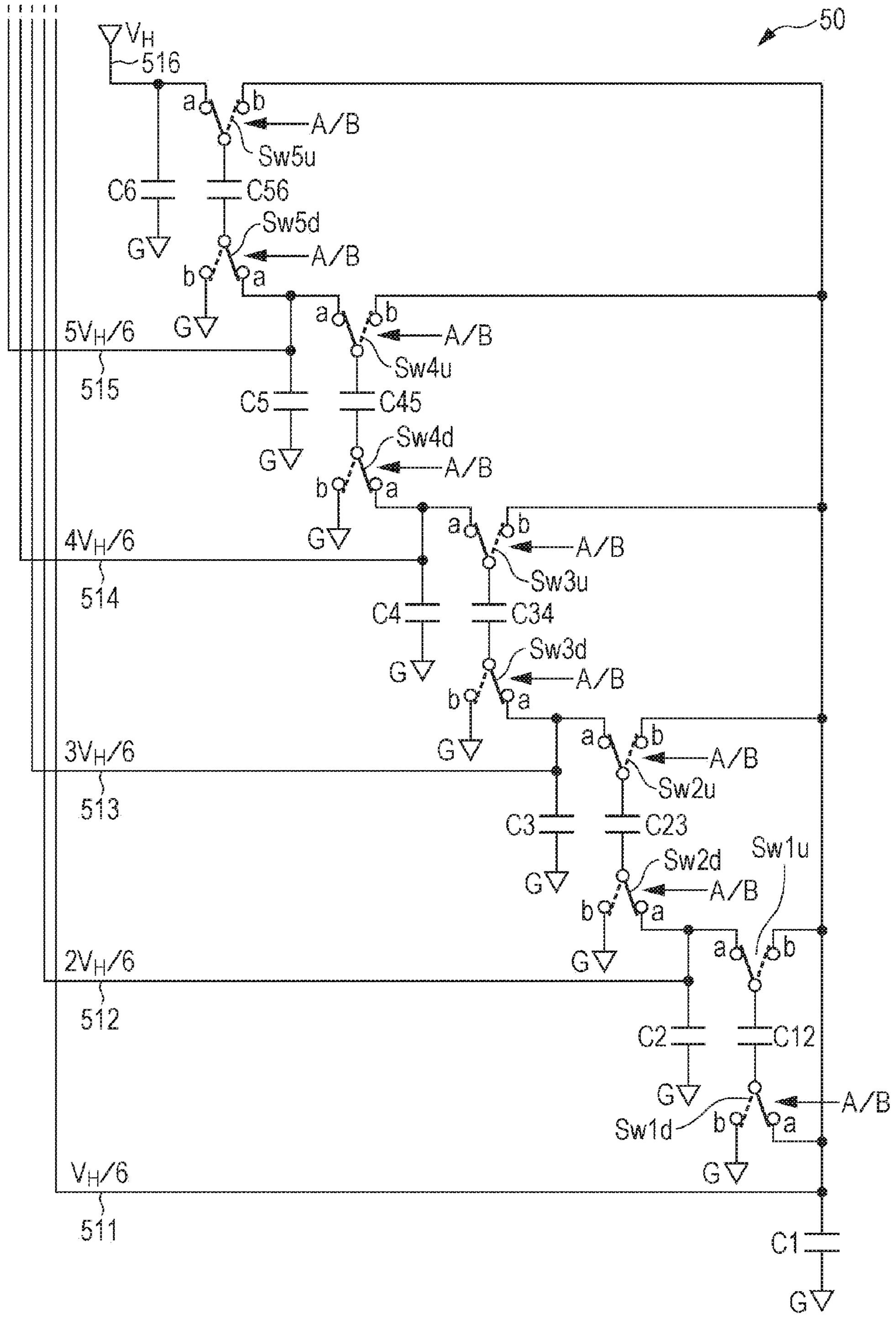
FIG. 13 is a diagram showing an example of a configuration of an auxiliary power source circuit.

FIG. 13 is a diagram showing an example of a configuration of an auxiliary power source portion 50.

As shown in the drawing, the auxiliary power source portion 50 is configured to include switches Sw1*d*, Sw1*u*, Sw2*d*, Sw2*u*, Sw3*d*, Sw3*u*, Sw4*d*, Sw4*u*, Sw5*d*, and Sw5*u*, and capacitive elements C12, C23, C34, C45, C56, C1, C2, C3, C4, C5, and C6.

Among these, any switch is a single pole double throw switch, and connects the common terminal to either of the terminals a and b according to the control signal A/B. For simplicity of the description, the control signal A/B is, for example, a pulse signal with a duty ratio of approximately 50%, and the frequency thereof is set to be, for example, approximately 20 times with respect to the frequency of the control signal COM0. Such a control signal A/B may be generated by an internal oscillator (not shown) in the auxiliary power source portion 50, and may be supplied from the control unit 10 via the FFC 70.

Meanwhile, the capacitive elements C12, C23, C34, C45, and C56 are for charge transfer, and the capacitive elements C1, C2, C3, C4, and C5 are for back up. The capacitive element C6 is for supply of the power source voltage $V_H$.

The switch is configured in practice by combination of transistors in a semiconductor integrated circuit, and the capacitive elements are externally mounted with respect to the semiconductor integrated circuit. It is desirable that the semiconductor integrated circuit have a configuration in which a plurality of the above-described drivers 30 are formed.

The power source wiring 516 that supplies the voltage $V_H$ in the auxiliary power source portion 50 is connected to one end of the capacitive element C6 and the terminal a of the switch Sw5*u*. The common terminal of the switch Sw5*u* is connected to one end of the capacitive element C56, and the other end of the capacitive element C56 is connected to the common terminal of the switch Sw5*d*. The terminal a of the switch Sw5*d* is connected to one end of the capacitive element C5 and the terminal a of the switch Sw4*u*. The common terminal of the switch Sw4*u* is connected to one end of the capacitive element C45, and the other end of the capacitive element C45 is connected to the common terminal of the switch Sw4*d*. The terminal a of the switch Sw4*d* is connected to one end of the capacitive element C4 and the terminal a of the switch Sw3*u*. The common terminal of the switch Sw3*u* is connected to one end of the capacitive element C34, and the other end of the capacitive element C34 is connected to the common terminal of the switch Sw3*d*. The terminal a of the switch Sw3*d* is connected to one end of the capacitive element C3 and the terminal a of the switch Sw2*u*. The common terminal of the switch Sw2*u* is connected to one end of the capacitive element C23, and the other end of the capacitive element C23 is connected to the common terminal of the switch Sw2*d*. The terminal a of the switch Sw2*d* is connected to one end of the capacitive element C2 and the terminal a of the switch Sw1*u*. The common terminal of the switch Sw1*u* is connected to one end of the capacitive element C12, and the other end of the capacitive element C12 is connected to the common terminal of the switch Sw1*d*. The terminal a of the switch Sw1*d* is connected to one end of the capacitive element C1.

One end of the capacitive element C5 is connected to the power source wiring 515. Similarly, one end of the capacitive elements C4, C3, C2, and C1 is connected to the power source wirings 514, 513, 512, and 511, respectively.

Each terminal b of the switches Sw5*u*, Sw4*u*, Sw3*u*, Sw2*u*, and Sw1*u* is connected to one end of the capacitive element C1 and to the terminal a of the switch Sw1*d*. The other end of the capacitive elements C6, C5, C4, C3, C2, and C1, and each terminal b of the switches Sw5*d*, Sw4*d*, Sw3*d*, Sw2*d*, and Sw1*d* are commonly grounded to the ground G.

Figure 14A:
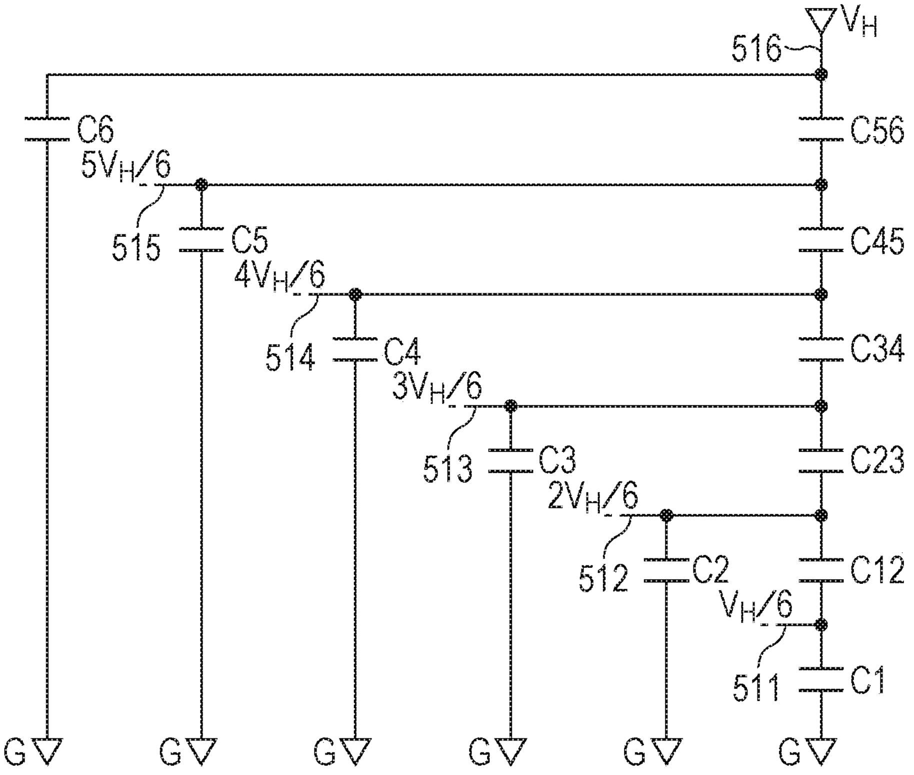
FIGS. 14A and 14B are operational explanatory diagrams of the auxiliary power source circuit.
Figure 14B:
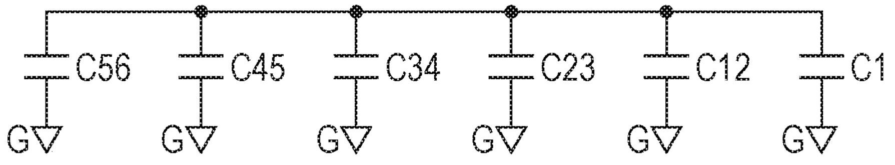

FIGS. 14A and 14B are diagrams showing the connection state of a switch in the auxiliary power source portion 50.

Each switch has the two states of a state (state A) in which the common terminal is connected to the terminal a by the control signal A/B, and a state (state B) in which the common terminal is connected to the terminal b. FIG. 14A is a diagram showing a simplification of the connection in state A in the auxiliary power source portion 50 with an equivalent circuit. FIG. 14B is a diagram showing a simplification of the connection in state B with an equivalent circuit.

In the state A, the capacitive elements C56, C45, C34, C23, C12, and C1 are connected in series from the voltage $V_H$ to the ground G. In the state B, since the one end of each of the capacitive elements C56, C45, C34, C23, C12, and C1 is connected to one another, the capacitive elements are connected in parallel, and the hold voltages are equalized.

Accordingly, the states A and B are alternately switched between, and the equalized voltage $V_H/6$ during the state B is multiplied by 1 to 5 times through the series connection in the state A, and the hold voltage at this time is supplied to the driver 30 via the power source wirings 511 to 515, along with being held by each of the capacitive elements C1 to C5.

Here, when the piezoelectric element 40 is charged by the driver 30, a lowering of the hold voltages among the capacitive elements C1 to C5 appears. In a capacitive element in which the hold voltage is lowered, since the redistribution due to the parallel connection of the state B is equalized, along with a charge from the power source being replenished by the series connection of the state A, if the overall auxiliary power source portion 50 is viewed, balance is established so as to maintain the voltages $V_H/6$, $2V_H/6$, $3V_H/6$, $4V_H/6$, and $5V_H/6$.

Meanwhile, if the piezoelectric element 40 is discharged by the driver 30, although a rising of the hold voltages among the capacitive elements C1 to C5 appears, since the redistribution due to the parallel connection of the state B is equalized along with the charge being discharged by the series connection of the state A, if the overall auxiliary power source portion 50 is viewed, balance is established so as to maintain the voltages $V_H/6$, $2V_H/6$, $3V_H/6$, $4V_H/6$, and $5V_H/6$. When the discharged charge is surplus without being absorbed by the capacitive elements C56, C45, C34, C23, C12, and C1, the surplus voltage is absorbed by the capacitive element C6, that is, regenerated to the power system. Therefore, if there is another load other than the piezoelectric element 40, the charge may be used in driving the load. If there is no other load, since the charge is absorbed by another capacitive element including the capacitive element C6, the power source voltage $V_H$ rises, that is, although a ripple occurs, this can be avoided in practice by increasing the capacity of a coupling condenser including the capacitive element C6. As can be understood from the above description, the auxiliary power source portion 50 (capacitive elements C1, C2, C3, C4, and C5) functions as elements (charge supply source) that supply a charge to each driver 30 (each piezoelectric element 40).

In the auxiliary power source portion 50, when the piezoelectric element 40 is discharged by the driver 30, although the hold voltage of any of the capacitive elements C1 to C6 corresponding to the power source wiring used in the discharge temporarily rises, balance is established so as to maintain the multiplied voltage of 1 to 6 times the voltage $V_H/6$ by repeatedly switching between the states A and B. Similarly, when the piezoelectric element 40 is charged, although the hold voltage of any of the capacitive elements C1 to C6 corresponding to the power source wiring used in the charging temporarily lowers, balance is established so as to maintain the multiplied voltage of 1 to 6 times the voltage $V_H/6$ by repeatedly switching between the states A and B.

As understood by viewing the voltage waveform of the control signal COM0 in FIG. 4, the voltage rise for drawing in ink and the voltage drop for causing ink to be discharged are a set, and the set is repeated in the print operation. Therefore, in the auxiliary power source portion 50, the voltage recovered by the discharge of the piezoelectric element 40 is used subsequently in charging.

Accordingly, in the embodiment, when the overall printing apparatus 100 is viewed, it is possible to suppress the power consumed to be low by recover and reuse of charge discharged from the piezoelectric element 40, and the stepwise charging and discharging of the driver 30.

In the auxiliary power source portion 50, when the common terminal of each switch switches connection from one of the terminal and b to the other, if there are variations in the characteristics of a plurality (10 in FIG. 13) of the switches, a state in which switching is not done all at once occurs, and both ends of the capacitive element may short. For example, when the terminal a is connected to the common terminal by the switches Sw1*u*, Sw1*d*, and Sw2*d* during switching, if a state in which the terminal b is connected to the common terminal by the switch Sw2*u* occurs, and both ends of the series connection of the capacitive elements C12 and C23 short.

Therefore, during switching of the switch, it is preferable that the configuration suppress the occurrence of the shorts through neutral state in which either of the terminals a and b is temporarily not connected.

Application and Modification Examples

The present invention is not limited to the embodiments described above, and, for example, various applications and modifications described below are possible. The forms of the applications and modifications described next can be arbitrarily selected or a plurality thereof can be combined.

Negative Feedback Control

Figure 15:
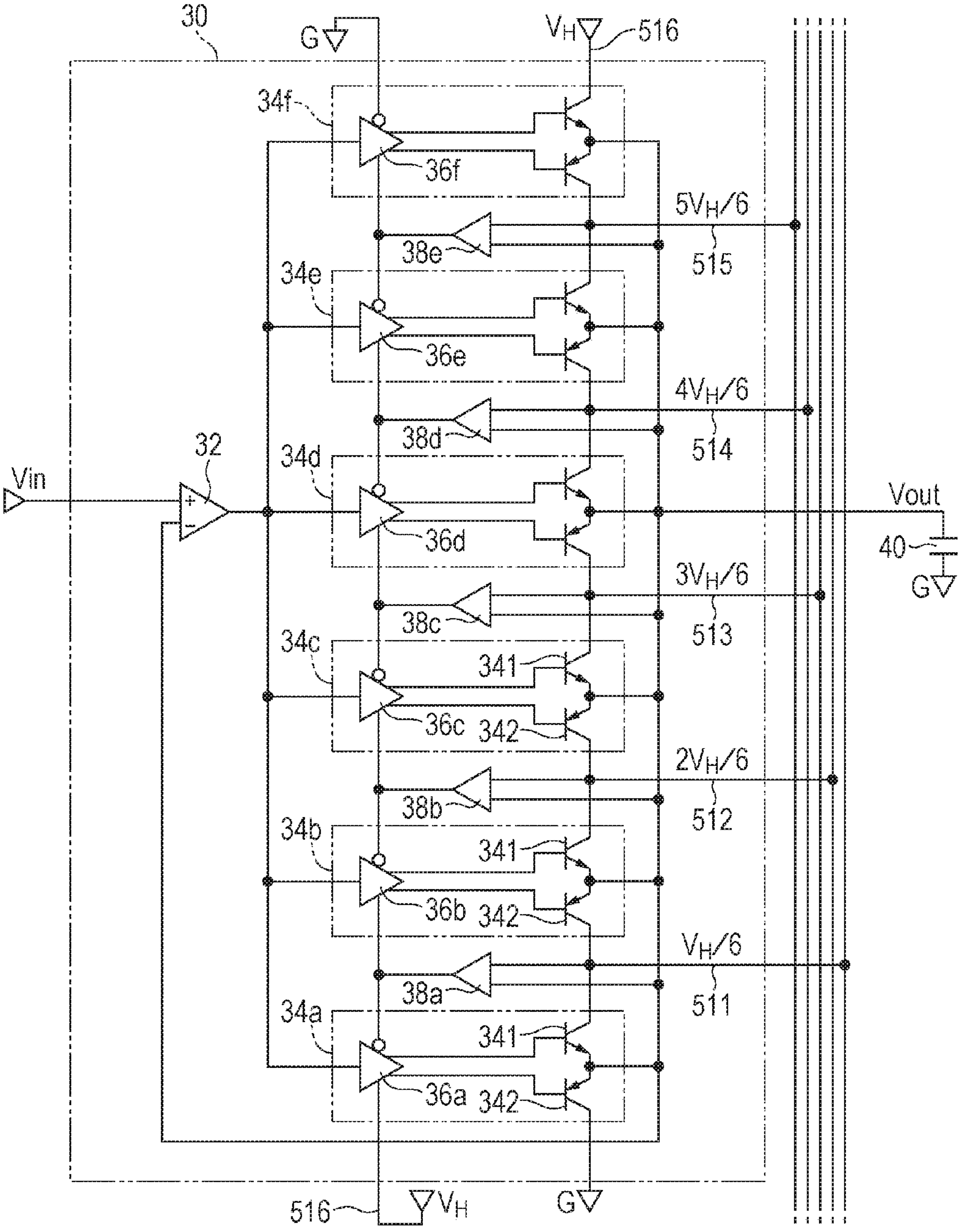
FIG. 15 is a diagram showing one example of a configuration of an application example (1) of the driver.

FIG. 15 is a diagram showing one example of a configuration of a driver 30 according to an application example (1) of the embodiment. As shown in FIG. 15, in the application example, the configuration is adopted in which negative feedback of the voltage Vout of one end of the piezoelectric element 40 to the input end (−) of the operational amplifier 32 is performed. In the configuration, when the voltage of the control signal Vin and the voltage Vout of the driving signal D are different, the transistors 341 and 342 are controlled in a direction eliminating the difference. Therefore, even in a case in which the responsiveness of the level shifters 36*a* to 36*f* and the transistors 341 and 342 is poor, it is possible for the voltage Vout to comparatively rapidly track the control signal Vin with high precision.

For the amount of negative feedback, it is preferable that the configuration be able to be appropriately set matching the characteristics of the level shifters 36*a* to 36*f*, and the transistors 341 and 342. For example, in the example in the drawing, although the operational amplifier 32 has a configuration that outputs a voltage in which the voltage Vout is subtracted from the voltage of the control signal Vin, the configuration may supply a voltage by multiplying the subtracted voltage by an appropriate coefficient to the level shifters 36*a* to 36*f*.

Figure 16:
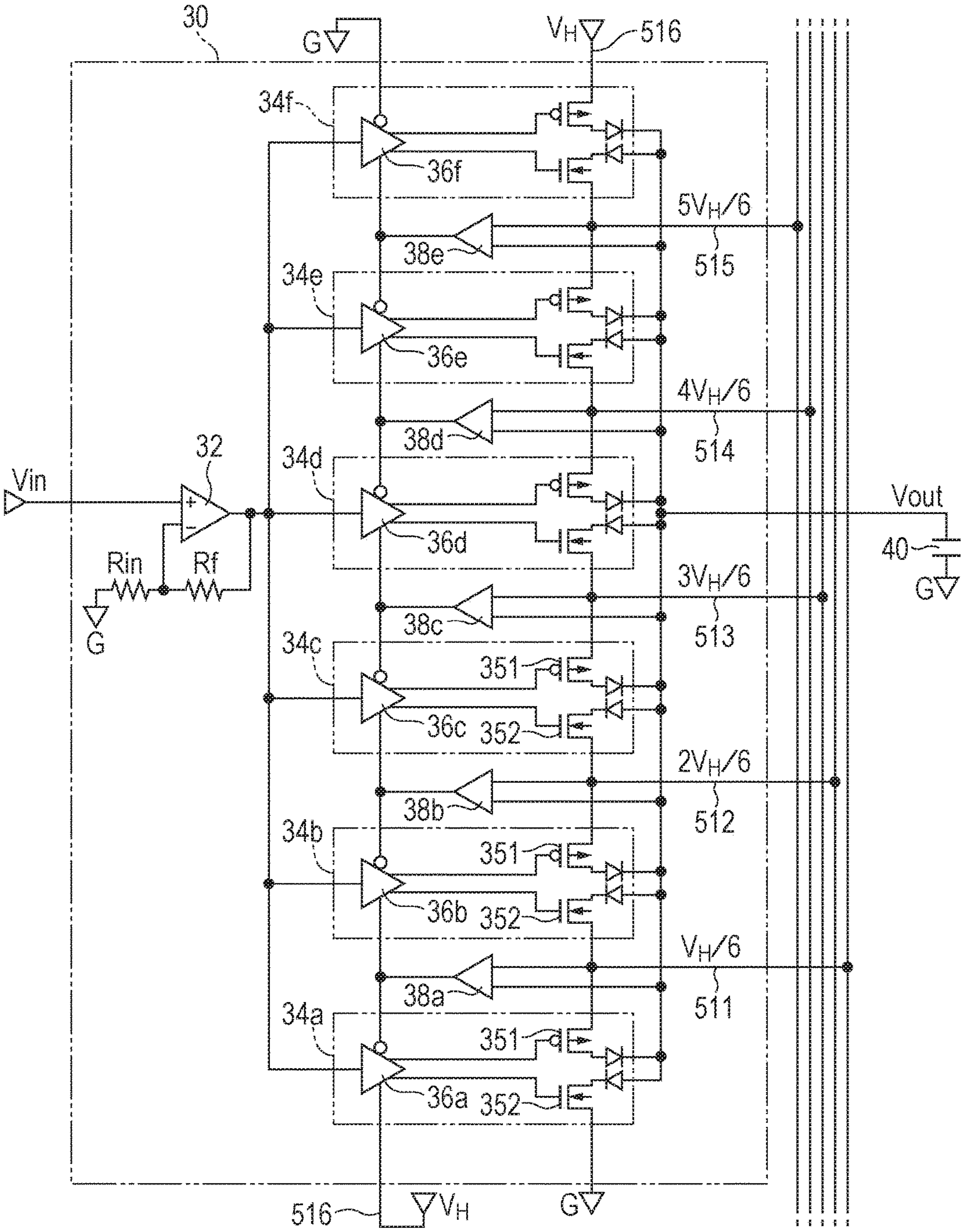
FIG. 16 is a diagram showing one example of a configuration of an application example (2) of the driver.

FIG. 16 is a diagram showing an example of a configuration of a driver 30 according to another application example (2) of the embodiment. In the driver 30 described in FIG. 5, the transistors 341 and 342 of the unit circuits 34*a* to 34*f* are set to the bipolar-type; however, in the application example (2) shown in FIG. 16, the transistors 341 and 342 are set to P-channel type and N-channel type MOSFETs (Metal Oxide Semiconductor Field Effect Transistor) 351 and 352, respectively.

In a case in which the MOSFETs 351 and 352 are used, a diode for preventing reverse current may be provided between each drain terminal and one end of the piezoelectric element 40. In addition, in a case in which the MOSFETs 351 and 352 are used, for the level shifters 36*a* to 36*f*, if in the enable state, a configuration is adopted in which the voltage of the control signal Vin is shifted in the negative direction by an amount that corresponds to a threshold voltage as a predetermined value to be supplied to the gate terminal of the P-channel type MOSFET 351, and the voltage of the control signal Vin is shifted in the positive direction by an amount that corresponds to a threshold voltage to be supplied to the gate terminal of the N-channel type MOSFET 352.

In a case in which the MOSFETs 351 and 352 are used, a configuration that negatively feeds back the voltage Vout, as shown in FIG. 15, may be applied.

Driving Target

In the above-described embodiment, the piezoelectric element 40 as a driving target of the driver 30 has been described as an example. The invention is not limited to the piezoelectric element 40 as a driving target, and is applicable to all loads that have a capacitive component, such as an ultrasonic motor, a touch panel, a flat speaker, or a display such as a liquid crystal.

Number of Stages of Unit Circuit

In the embodiment, the configuration includes six stages of unit circuits 34*a* to 34*f* in ascending order of the voltages so as to correspond to two adjacent voltages of the seven types of voltage; however, in the present invention the number of stages of unit circuit is not limited, and may be two or more. In addition, the voltages are not necessarily at even intervals.

Comparator

In the configuration of the embodiment, if the determination result of the comparator 38*a*, for example, is false (the output signal is at the L level), the voltage is detected to be in the first state, and if the determination result of the comparator 38*a* is true (output signal is at the H level), and the determination result of the comparator 38*b* is false, the voltage is detected to be in the second state. That is, the configurations that detect the first state and the second state partially overlap rather than each being separate, and detect the first state to the sixth state with the comparators 38*a* to 38*e* as a whole. The invention is not limited thereto, and a configuration that individually detects each state may be used.

Level Shifter in Disable State

In the embodiment, although the configuration of the level shifters 36*a* to 36*f* in the disable state supplies the voltage zero to the base (gate) terminal of the transistor 341 (351), and supplies the voltage $V_H$ to the base (gate) terminal of the transistor 342 (352), if the transistors 341 and 342 are able to be turned off, there is no limitation thereto. For example, the level shifters 36*a* to 36*f* may have a configuration that supplies an off signal in which the voltage of the control signal Vin is shifted in the positive direction to the base (gate) terminal of the transistor 341 (351) and supplies an off signal in which the voltage of the control signal Vin is shifted in the negative direction to the base (gate) terminal of the transistor 342 (351) in the disable state.

According to this configuration, since the withstand voltage of the transistors 341 (351) and 342 (352) is low, it is possible to reduce the device size when forming the semiconductor substrate.

What is claimed is:

1. A capacitive load drive circuit comprising:

a first driving signal generator that generates a first driving signal from a first control signal according to a characteristic of a first capacitive load;

a second driving signal generator that generates a second driving signal from a second control signal according to a characteristic of a second capacitive load; and a control signal supply portion that supplies a common control signal to the first driving signal generator and the second driving signal generator;

wherein the first driving signal generator corrects the common control signal to generate the first control signal, and the second driving signal generator corrects the common control signal to generate the second control signal.

2. The capacitive load drive circuit according to claim 1, wherein waveforms of the first driving signal are different from waveforms of the second driving signal.

3. The capacitive load drive circuit according to claim 1, wherein the first driving signal generator includes a first control signal correction portion that corrects the common control signal according to the characteristic of the first capacitive load, and generates the first driving signal from the first control signal after correction of the common control signal by the first control signal correction portion, and wherein the second driving signal generator includes a second control signal correction portion that corrects the common control signal according to the characteristic of the second capacitive load, and generates the second driving signal from the second control signal after correction of the common control signal by the second control signal correction portion.

4. The capacitive load drive circuit according to claim 3, wherein the first control signal correction portion and the second control signal correction portion each include:

a first holding portion that holds a first correction value;

a second holding portion that holds a second correction value; and a correction processor that corrects the amplitude of the common control signal according to the first correction value and corrects a reference voltage of the common control signal according to the second correction value.

5. The capacitive load drive circuit according to claim 3, wherein the first driving signal generator includes:

a first voltage generator that generates a plurality of voltages; and a connection path selector that selects the plurality of voltages generated by the first voltage generator according to the first control signal after correction of the common control signal by the first control signal correction portion, and supplies the voltages as the first driving signal to a capacitive load, and wherein the second driving signal generator includes:

a second voltage generator that generates a plurality of voltages; and a connection path selector that selects the plurality of voltages generated by the second voltage generator according to the second control signal after correction of the common control signal by the second control signal correction portion, and supplies the voltages as the second driving signal to a capacitive load.

* * * * *